United States Patent
Collins et al.

(10) Patent No.: US 7,666,464 B2
(45) Date of Patent: *Feb. 23, 2010

(54) RF MEASUREMENT FEEDBACK CONTROL AND DIAGNOSTICS FOR A PLASMA IMMERSION ION IMPLANTATION REACTOR

(75) Inventors: Kenneth S. Collins, San Jose, CA (US); Hiroji Hanawa, Sunnyvale, CA (US); Kartik Ramaswamy, Santa Clara, CA (US); Amir Al-Bayati, San Jose, CA (US); Andrew Nguyen, San Jose, CA (US); Biagio Gallo, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 901 days.

This patent is subject to a terminal disclaimer.

(21) Appl. No.: 10/971,772

(22) Filed: Oct. 23, 2004

(65) Prior Publication Data

US 2006/0088655 A1 Apr. 27, 2006

(51) Int. Cl.
*C23C 14/48* (2006.01)
*C23C 14/54* (2006.01)
*C23C 16/52* (2006.01)
*C23C 16/505* (2006.01)

(52) U.S. Cl. ............................ 427/8; 427/523; 427/526; 427/527; 438/14; 438/5; 438/10; 438/514; 438/513

(58) Field of Classification Search ........................ None
See application file for complete search history.

(56) References Cited

U.S. PATENT DOCUMENTS

| 2,344,138 A | 3/1944 | Drummond | 117/107 |
| 3,109,100 A | 10/1963 | Gecewicz | 250/219 |
| 3,576,685 A | 4/1971 | Swann et al. | 148/187 |

(Continued)

FOREIGN PATENT DOCUMENTS

EP 0 546 852 A1 6/1993

(Continued)

OTHER PUBLICATIONS

Wolf, Stanley and Taubner, Richard, "Silicon Processing for the VLSI Era", 2000, Lattice Press, vol. 1, pp. 303-308.

(Continued)

*Primary Examiner*—Marianne L Padgett
(74) *Attorney, Agent, or Firm*—Law Office of Robert M. Wallace

(57) ABSTRACT

A method of measuring ion dose in a plasma immersion ion implantation reactor during ion implantation of a selected species into a workpiece includes placing the workpiece on a pedestal in the reactor and feeding into the reactor a process gas comprising a species to be implanted into the workpiece, and then coupling RF plasma source power to a plasma in the reactor. It further includes coupling RF bias power to the workpiece by an RF bias power generator that is coupled to the workpiece through a bias feedpoint of the reactor and measuring RF current at the feedpoint to generate a current-related value, and then integrating the current-related over time to produce an ion implantation dose-related value.

39 Claims, 13 Drawing Sheets

U.S. PATENT DOCUMENTS

| | | | |
|---|---|---|---|
| 3,907,616 A | 9/1975 | Wiemer | 148/188 |
| 4,021,675 A | 5/1977 | Shifrin | 250/492 |
| 4,116,791 A | 9/1978 | Zega | 204/192 |
| 4,184,188 A | 1/1980 | Briglia | 361/234 |
| 4,357,536 A | 11/1982 | Varma et al. | 250/397 |
| 4,382,099 A | 5/1983 | Legge et al. | 427/34 |
| 4,384,918 A | 5/1983 | Abe | 156/643 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,584,026 A | 4/1986 | Wu et al. | 148/1.5 |
| 4,692,836 A | 9/1987 | Suzuki | 361/234 |
| 4,698,104 A | 10/1987 | Barker et al. | 437/141 |
| 4,764,394 A | 8/1988 | Conrad | 427/38 |
| 4,771,730 A | 9/1988 | Tezuka | 118/723 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 4,962,461 A * | 10/1990 | Meyer et al. | 438/8 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,319,212 A | 6/1994 | Tokoro | 250/492.21 |
| 5,345,999 A | 9/1994 | Hosokawa | 165/802 |
| 5,354,381 A | 10/1994 | Sheng | 118/723 |
| 5,423,945 A | 6/1995 | Marks et al. | 156/662.1 |
| 5,435,881 A | 7/1995 | Ogle | 156/345 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,515,167 A | 5/1996 | Ledger et al. | 356/357 |
| 5,520,209 A | 5/1996 | Goins et al. | 137/246 |
| 5,542,559 A | 8/1996 | Kawakami et al. | 216/67 |
| 5,561,072 A | 10/1996 | Sato | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/237 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,770,982 A | 6/1998 | Moore | 333/32 |
| 5,880,923 A | 3/1999 | Hausmann | 361/234 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,096,661 A | 8/2000 | Ngo et al. | 438/788 |
| 6,101,971 A | 8/2000 | Denholm et al. | 118/723 E |
| 6,103,599 A | 8/2000 | Henley et al. | 438/459 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,313,002 B1 * | 11/2001 | Fukuda | 438/373 |
| 6,323,951 B1 * | 11/2001 | Borden et al. | 356/502 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,350,697 B1 | 2/2002 | Richardson et al. | 438/710 |
| 6,392,351 B1 | 5/2002 | Shun'ko | 315/111.51 |
| 6,395,150 B1 | 5/2002 | Can Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,433,553 B1 | 8/2002 | Goeckner et al. | 324/464 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,494,986 B1 | 12/2002 | Hanawa et al. | 156/345.35 |
| 6,500,686 B2 | 12/2002 | Katata et al. | 438/22 |
| 6,507,155 B1 | 1/2003 | Barnes et al. | 315/111.51 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,528,805 B2 | 3/2003 | Fang et al. | 250/492.21 |
| 6,551,446 B1 | 4/2003 | Hanwa et al. | 156/345.48 |
| 6,559,408 B2 | 5/2003 | Smith et al. | 219/121.57 |
| 6,579,805 B1 | 6/2003 | Bar-Gadda | 438/710 |
| 6,582,999 B2 | 6/2003 | Henley et al. | 438/221 |
| 6,583,572 B2 | 6/2003 | Veltrop et al. | 315/111.51 |
| 6,593,173 B1 | 7/2003 | Anc et al. | 438/149 |
| 6,627,463 B1 * | 9/2003 | Sarfaty | 438/7 |
| 6,679,981 B1 | 1/2004 | Pan et al. | 204/298.06 |
| 6,687,113 B2 | 2/2004 | Saito et al. | 361/234 |
| 6,800,559 B2 | 10/2004 | Bar-Gadda | 438/710 |

| | | | | | |
|---|---|---|---|---|---|
| 6,811,448 B1 | 11/2004 | Paton et al. ............... 439/706 | JP | 59-218728 | 12/1984 |
| 6,838,695 B2 | 1/2005 | Doris et al. ................ 257/55 | JP | 62-120041 | 6/1987 |
| 6,960,498 B2 * | 11/2005 | Nakamura .............. 438/181 | JP | 11-317190 A  * | 11/1999 |
| 7,037,813 B2 * | 5/2006 | Collins et al. ............ 438/510 | WO | WO 99/00832 | 1/1999 |
| 7,303,982 B2 * | 12/2007 | Collins et al. ............ 438/514 | WO | WO 01/11650 A1 | 2/2001 |
| 2001/0042827 A1 | 11/2001 | Fang et al. | WO | WO 02/25694 A2 | 3/2002 |
| 2002/0047543 A1 | 4/2002 | Sugai et al. ............ 315/111.21 | WO | WO 93/18201 | 9/2003 |
| 2002/0124959 A1 | 9/2002 | Denda et al. ........... 156/345.28 | | | |
| 2002/0185228 A1 | 12/2002 | Chen et al. ............ 156/345.48 | | | |
| 2003/0013260 A1 | 1/2003 | Gossman et al. ............ 438/301 | | | |
| 2003/0013314 A1 | 1/2003 | Ying et al. ................ 438/710 | | | |
| 2003/0085205 A1 | 5/2003 | Lai et al. ................ 219/121.43 | | | |
| 2004/0150386 A1 | 8/2004 | Gonzalez et al. ........... 324/117 | | | |
| 2005/0223991 A1 * | 10/2005 | Walther et al. .......... 118/723 R | | | |
| 2007/0200075 A1 * | 8/2007 | Walther et al. ......... 250/492.21 | | | |
| 2008/0318345 A1 * | 12/2008 | Persing et al. ................ 438/7 | | | |

FOREIGN PATENT DOCUMENTS

| | | | |
|---|---|---|---|
| EP | 0 836 218 A2 | | 4/1998 |
| EP | 0942453 A1 | * | 9/1999 |
| EP | 0 964 074 A2 | | 12/1999 |
| EP | 1 111 084 A1 | | 6/2001 |
| EP | 1 158 071 A2 | | 11/2001 |
| EP | 1 191 121 A1 | | 3/2002 |
| JP | 59-86214 | | 5/1984 |

OTHER PUBLICATIONS

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

JP 070455542, dated Feb. 14, 1995, Japan, Matsushita Electric Ind Co Ltd.

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

Zhang, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, now USPN 6,216,479, filed Aug. 11, 2000, entitled, "Externally Excited Torroidal Plasma Source," By Hanwa, et al.

* cited by examiner

RF MEASUREMENT FEEDBACK CONTROL AND DIAGNOSTICS FOR A PLASMA IMMERSION ION IMPLANTATION REACTOR

BACKGROUND OF THE INVENTION

Ion implantation processes in integrated circuit fabrication typically require instrumentation and control to achieve a desired ion dose on a semiconductor wafer. The dose is the total number of ions per unit area passing through an imaginary surface plane of the wafer. The implanted ions distribute themselves throughout the volume of the wafer. The principal variation in implanted ion density (number of ions per unit volume) occurs along the direction of the ion flux, usually the perpendicular (vertical) direction relative to the wafer surface. The distribution of ion density (ions per unit volume) along the vertical direction is referred to as the ion implantation depth profile. Instrumentation and control systems for regulating ion implant dose (ions per unit area) is sometimes referred to as dosimetry.

Ion beam implant machines, which generate a narrow ion beam that must be raster-scanned over the surface of the wafer, typically implant only a single atomic species at one time. The ion current in such a machine is precisely measured and integrated over time to compute the actual dose. Because the entire ion beam impacts the wafer and because the atomic species in the beam is known, the ion implant dose can be accurately determined. This is critical in an ion beam implant machine, because it employs a D.C. ion source, which is subject to significant drift in its output current, and the various grids and electrodes employed in the beam implant machine drift as well (due to the susceptibility of a D.C. source to accumulation of deposited material on component surfaces). Accordingly, precise dosimetry is essential in an ion beam implant machine, but (fortunately) is readily implemented. The precisely monitored ion beam current is integrated over time to compute an instantaneous current implant dose, and the process is halted as soon as the dose reaches a predetermined target value.

In contrast, plasma immersion ion implantation reactors present a difficult problem in dosimetry. Typically, the atomic weight of the ions incident on the wafer cannot be precisely determined because such a reactor employs a precursor gas containing the desired ion implantation species as well as other species. For example, since pure boron is a solid at room temperature, plasma immersion ion implantation of boron must employ a multi-species gas such as B2H6 as the plasma precursor, so that both boron and hydrogen ions are incident on the wafer. As a result, determining the boron dose from a measured current is difficult. Another difficulty in implementing dosimetry in a plasma immersion ion implantation reactor is that the plasma ions impact the entire wafer continuously, so that it is difficult to effect a direct measurement above the wafer of the total ion current to the wafer. Instead, the dose must be indirectly inferred from measurements taken over a very small area. In contrast, the current in the very narrow ion beam of a beam implant machine can be precisely measured/monitored. A further difficulty encountered in some plasma immersion ion implantation reactors is the presence of electromagnetic noise or interference in the chamber that can prevent a precise measurement of ion current. This is particularly true of reactors employing RF plasma source power or RF plasma bias power.

Plasma immersion ion implantation reactors employing D.C. (or pulsed D.C.) plasma source power are susceptible to drift in the plasma ion current due to deposition of material on internal reactor components from the plasma. Such reactors therefore require precise real-time dosimetry. This problem has been addressed by providing a small orifice in the wafer support pedestal or cathode outside of the wafer periphery, for plasma ions to pass through into the interior volume of the cathode. An electrode sometimes referred to as a Faraday cup faces the orifice and is biased to collect the ions passing through the orifice. The interior of the cathode can be evacuated to a slightly lower pressure than the plasma chamber to ensure efficient collection of ions through the orifice. A current sensor inside the cathode interior measures the current flowing between the ion-collecting electrode and its bias source. This current can be used as the basis of a dosimetry measurement. One problem with such an arrangement is that the current measurement cannot distinguish between different atomic species, and therefore cannot provide an accurate measurement of the species of interest (e.g., boron). Another problem is that the transmission of the measured current from the current sensor inside the cathode interior to an external controller or processor can be distorted by the noisy electromagnetic environment of the plasma reactor.

Another problem is that the orifice in the cathode constitutes an intrusion upon the ideal plasma environment, because the orifice can distort the electric field in the vicinity of the wafer periphery. Furthermore, plasma passing through the orifice can cause problems by either sputtering the orifice surfaces or by depositing on the orifice interior surfaces, requiring the periodic cleaning of the orifice interior.

In plasma immersion ion implantation reactors employing RF plasma source power, precise or real-time dose measurement typically is not critical. This is due in part to the fact that an RF plasma is relatively impervious to deposition of material on internal chamber components, so that the ion flux at the wafer surface does not drift significantly, compared to a reactor employing a D.C. plasma source. Moreover, real-time dose measurement in such a reactor is difficult. For example, the harsh RF environment of such a reactor would distort an ion current measurement taken inside the cathode (as described above) as it is conveyed to an external controller or processor. To avoid such problems, implant dose can be reliably controlled based upon the predicted or estimated time required to reach the target implant dose.

Nevertheless, it would be beneficial if precise real-time dosimetry could be provided in an RF plasma immersion ion implantation reactor. Moreover, in either a D.C. or RF plasma immersion ion implantation reactor, it would be beneficial if precise real-time dosimetry could be provided without any intrusive features, such as (for example) the ion-collecting orifice in the cathode referred to above.

SUMMARY OF THE INVENTION

A method of measuring ion dose in a plasma immersion ion implantation reactor during ion implantation of a selected species into a workpiece includes placing the workpiece on a pedestal in the reactor and feeding into the reactor a process gas comprising a species to be implanted into the workpiece, and then coupling RF plasma source power to a plasma in the reactor. It further includes coupling RF bias power to the workpiece by an RF bias power generator that is coupled to the workpiece through a bias feedpoint of the reactor and measuring RF current at or near the feedpoint to generate a current-related value, and then integrating the current-related over time to produce a dose-related value.

The method can further include dividing by the area of the workpiece and by the charge of a single ion of a plasma in the reactor one of (a) the current-related value or (b) the dose-related value. The method can also include multiplying one of (a) the current-related value or (b) the dose-related value by an ion efficiency factor corresponding to the proportion of the selected species relative to the total ions implanted into the workpiece.

The method ion efficiency factor can be determined by sensing present values of a predetermined set of process parameters, applying the present values to corresponding inputs of a look-up table, and obtaining from the look-up table the ion efficiency factor. The look-up table may be constructed prior to the step of placing the workpiece in the reactor by ion implanting plural test workpieces in the reactor under different process conditions corresponding to different values of the predetermined set of process parameters, and testing each of the test workpieces to determine an ion efficiency factor for each of the test workpieces and then correlating in the look-up table each measured ion dose to the corresponding set of values of the set of process parameters.

The step of integrating the RF current may be preceded by transforming the RF current from the measurement point (which may be at or displaced from the feedpoint) to a location at least near the workpiece by a measurement point-to-workpiece transformation.

A feedback control loop may be implemented by coupling RF source power at a selected source power level to plasma in a process zone of the reactor over the workpiece, comparing the current-related value with a target flux value and generating a flux error value, and changing the selected source power level by an amount that is a function of the flux error value. End point control may be implemented by comparing the dose-related value to a target dose value, and halting the ion implantation of the workpiece when the dose-related value reaches the target dose value.

A method of measuring ion energy of the selected species includes measuring RF voltage at or near the feedpoint and determining from the RF voltage the ion energy of the selected species. The step of determining the ion energy includes determining a time average of the RF voltage or determining the peak of the RF voltage or the peak-to-peak of the RF voltage or the RMS (root-mean-square) value of the RF voltage and may further include multiplying the time average by the charge of an ion of the selected species in the plasma in the reactor. A feedback control loop may be implemented by comparing the ion energy with a target ion energy value to determine an ion energy error, and adjusting the power level of the RF bias power by an amount that is a function of the ion energy error.

For greater accuracy, the method may further include transforming the RF voltage from the measurement point to a location at least near the workpiece by a measurement-point-to-workpiece transformation.

In a toroidal source plasma reactor wherein RF plasma source power is coupled into the interior of an external reentrant conduit of the reactor to generate a toroidal plasma current across a process region of the reactor and through the conduit, a method for measuring current, a voltage-related value and a power-related value of the plasma includes measuring RF current flow through the external reentrant conduit, measuring RF voltage drop along an axis of the external reentrant conduit using at least two voltage probes coupled to the plasma and separated by some distance along the longitudinal axis of the conduit and determining therefrom a loop voltage of the toroidal plasma current, and determining a plasma power-related value from the RF current flow and from the RF voltage drop. The method may further include comparing the plasma power-power related value with a target power-related value level to produce a power-related value difference error, and changing the level of the RF plasma source power by an amount corresponding to the power-related value difference error.

The method can further include taking only the real part of the current flow measured along an axis of the external reentrant conduit.

DETAILED DESCRIPTION OF INVENTION

Introduction

Figure 1:
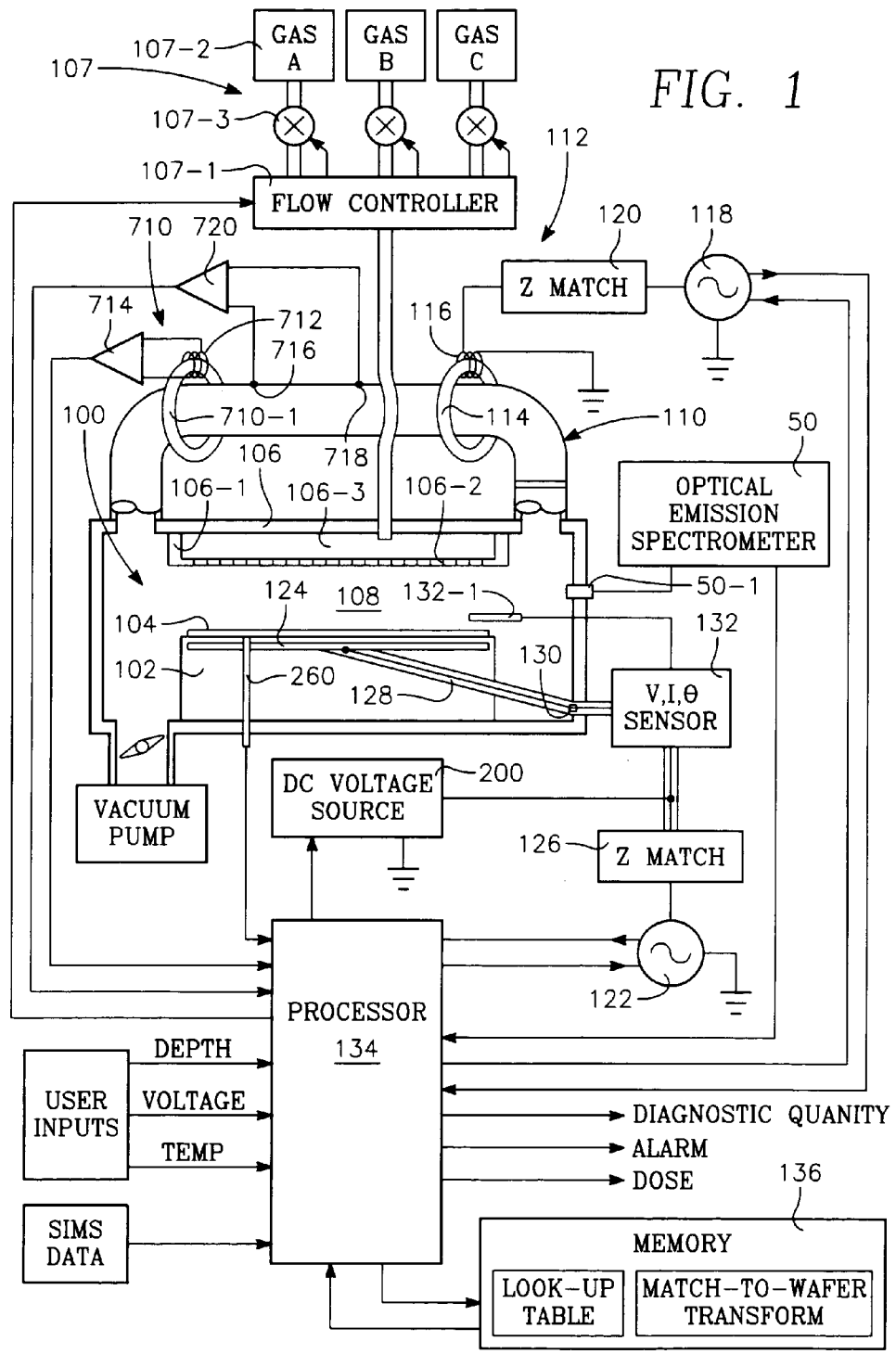
FIG. 1 depicts a plasma immersion ion implantation reactor capable of carrying out the invention.

A method of measuring ion dose in a plasma immersion ion implantation reactor during ion implantation of a selected species into a workpiece includes placing the workpiece on a pedestal in the reactor and feeding into the reactor a process gas comprising a species to be implanted into the workpiece, and then coupling RF plasma source power to a plasma in the reactor. It further includes coupling RF bias power to the workpiece by an RF bias power generator that is coupled to the workpiece through a bias feedpoint of the reactor and measuring RF current at or near the feedpoint to generate a current-related value, and then integrating the current-related over time to produce a dose-related value.

The method may further include measuring RF voltage at or near the feedpoint.

The method may further include measuring the phase between said RF current at or near the feedpoint and the RF voltage at or near the feedpoint.

The method may include using a current probe at or near a feedpoint to obtain the bias current.

The method may include using a voltage probe at or near a feedpoint to obtain the bias voltage.

The method may include a directional coupler at or near the feedpoint to obtain forward and reverse voltage or current signals, which can be transformed to obtain current.

The method may include a directional coupler at or near the feedpoint to obtain forward and reverse voltage or current signals, which can be transformed to obtain voltage.

The method may include measuring or calculating an impedance (ratio of RF voltage to RF current) or admittance (ratio of current to voltage) at or near the feedpoint.

The method can further include taking only the real part of the RF current, such as by multiplying the RF current value by the cosine of the impedance phase angle.

The method can further include measuring the fundamental RF current and/or the fundamental RF voltage at or near the feed point and one or more harmonics of said RF current and/or voltage signals.

The method may further include transforming the RF current from the measurement point or feedpoint to a location at least near the workpiece by a measurement-point-to-workpiece transformation. The measurement-point-to-workpiece transformation may be determined prior to placing the workpiece in the reactor by measuring a complex open circuit input impedance (or admittance) at the measurement point or feedpoint (no load or "open circuit" connected at workpiece), measuring a complex short circuit input impedance (or admittance) at the measurement point or feedpoint (shorted load or "short circuit" connected at workpiece), and then computing the measurement-point-to-workpiece transformation from a combination of the open circuit input impedance (or admittance) and the short circuit input impedance (admittance) and from the measured values of RF current and RF voltage and phase.

The method may further include taking a transformed-current-related value, such as the RMS, peak or peak-to-peak value of the transformed RF current at or near the workpiece.

The method may further include transforming harmonics of the fundamental RF current from the measurement point or feedpoint to a location at least near the workpiece by a measurement-point-to-workpiece transformation.

The method may further include transforming the transformed harmonic series of current signals from frequency domain to time domain, such as with an inverse-fast-Fourier-transform, to obtain a time domain current waveform at or near the workpiece.

The method may further include taking a transformed-current-related value, such as the RMS, peak or peak-to-peak value of the transformed RF current waveform at or near the workpiece.

The method can further include dividing by the area of the workpiece and by the charge of a single ion of a plasma in the reactor one of (a) the current-related value or (b) the dose-related value. The method can also include multiplying one of (a) the current-related value or (b) the dose-related value by an ion efficiency factor corresponding to the proportion of the selected species relative to the total ions implanted into the workpiece.

The method ion efficiency factor can be determined by sensing present values of a predetermined set of process parameters, applying the present values to corresponding inputs of a look-up table, and obtaining from the look-up table the ion efficiency factor. The look-up table may be constructed prior to the step of placing the workpiece in the reactor by ion implanting plural test workpieces in the reactor under different process conditions corresponding to different values of the predetermined set of process parameters, and testing each of the test workpieces to determine an ion efficiency factor for each of the test workpieces and then correlating in the look-up table each measured ion dose to the corresponding set of values of the set of process parameters.

The step of integrating the RF current may be preceded by transforming the RF current from the measurement point (which may be at or displaced from the feedpoint) to a location at least near the workpiece by a measurement point-to-workpiece transformation. The measurement-point-to-workpiece transformation may be determined prior to placing the workpiece in the reactor by measuring a complex open circuit input impedance (or admittance) at the measurement point (no load or "open circuit" connected at workpiece), measuring a complex short circuit input impedance (or admittance) at the measurement point (shorted load or "short circuit" connected at workpiece), and then computing the measurement-point-to-workpiece transformation from a combination of the open circuit input impedance (or admittance) and the short circuit input impedance (admittance) and from the measured values of RF current and RF voltage and phase.

Alternatively, the open circuit current and voltage and phase and the short circuit current and voltage and phase may be measured at the measurement point. Then the measurement point-to-workpiece transform may be calculated from a combination of open circuit current, voltage and phase and the short circuit current, voltage and phase measured at the measurement point.

The step of integrating the RF current may be preceded by transforming the RF current from the measurement point to a location at least near the workpiece by a measurement-point-to-workpiece transformation and may further include taking a transformed-current-related value, such as the RMS, peak or peak-to-peak value of the transformed RF current at or near the workpiece. The method can further include taking only the real part of the transformed RF current.

The step of integrating the RF current may be preceded by transforming the RF current from the measurement point or feedpoint to a location at least near the workpiece by a measurement-point-to-workpiece transformation and may further include transforming harmonics of the fundamental RF current from the measurement point to a location at least near the workpiece by a measurement point-to-workpiece transformation.

The step of integrating the RF current may be preceded by transforming the RF current and harmonics of the fundamental RF current from the measurement point to a location at least near the workpiece by a measurement-point-to-workpiece transformation and may further include transforming the transformed harmonic series of current signals from frequency domain to time domain, such as with an inverse-fast-Fourier-transform, to obtain a time domain current waveform at or near the workpiece.

The step of integrating the RF current may be preceded by transforming the RF current and harmonics of the fundamental RF current from the measurement point or feedpoint to a location at least near the workpiece by a measurement-point-to-workpiece transformation and may further include transforming the transformed harmonic series of current signals from frequency domain to time domain, such as with an inverse-fast-Fourier-transform, to obtain a time domain current waveform at or near the workpiece and may further include taking a transformed-current-related value, such as the RMS, peak or peak-to-peak value of the transformed RF current waveform at or near the workpiece.

The method can further include taking only the real part of the transformed RF current.

A feedback control loop may be implemented by coupling RF source power at a selected source power level to plasma in a process zone of the reactor over the workpiece, comparing the current-related value with a target flux value and generating a flux error value, and changing the selected source power level by an amount that is a function of the flux error value. End point control may be implemented by comparing the dose-related value to a target dose value, and halting the ion implantation of the workpiece when the dose-related value reaches the target dose value.

A method of measuring ion energy of the selected species includes measuring RF voltage at or near the feedpoint and determining from the RF voltage the ion energy of the selected species. The step of determining the ion energy includes determining a time average of the RF voltage or determining the peak of the RF voltage or the peak-to-peak of the RF voltage or the RMS (root-mean-square) value of the RF voltage and may further include multiplying the time average by the charge of an ion of the selected species in the plasma in the reactor. A feedback control loop may be implemented by comparing the ion energy with a target ion energy value to determine an ion energy error, and adjusting the power level of the RF bias power by an amount that is a function of the ion energy error.

The method may further include measuring RF current at or near the feedpoint.

The method may further include measuring the phase between the RF current at or near the feedpoint and the RF voltage at or near the feedpoint.

The method may include using a current probe at or near a feedpoint to obtain the bias current.

The method may include using a voltage probe at or near a feedpoint to obtain the bias voltage.

The method may include a directional coupler at or near the feedpoint to obtain forward and reverse voltage or current signals, which can be transformed to obtain current.

The method may include a directional coupler at or near the measurement point to obtain forward and reverse voltage or current signals, which can be transformed to obtain voltage.

The method may include measuring or calculating an impedance (ratio of RF voltage to RF current) or admittance (ratio of current to voltage) at or near the feedpoint.

For greater accuracy, the method may further include transforming the RF voltage from the measurement point to a location at least near the workpiece by a measurement-point-to-workpiece transformation. The measurement-point-to-workpiece transformation may be determined prior to placing the workpiece in the reactor by measuring a complex open circuit input impedance (or admittance) at the measurement point or feedpoint (no load or "open circuit" connected at workpiece), measuring a complex short circuit input impedance (or admittance) at the measurement point or feedpoint (shorted load or "short circuit" connected at workpiece), and then computing the measurement-point-to-workpiece transformation from a combination of the open circuit input impedance (or admittance) and the short circuit input impedance (admittance) and from the measured values of RF current and RF voltage and phase.

Alternatively, the open circuit current and voltage and phase and the short circuit current and voltage and phase may be measured at the measurement point. Then the measurement point-to-workpiece transform may be calculated from a combination of open circuit current and voltage and phase and the short circuit current and voltage and phase measured at the measurement point.

The method may further include taking a transformed-voltage-related value, such as the RMS, peak or peak-to-peak value of the transformed RF voltage at or near the workpiece.

The method may further include transforming harmonics of the fundamental RF voltage from the feedpoint to a location at least near the workpiece by a measurement-point-to-workpiece transformation.

The method may further include transforming the transformed harmonic series of voltage signals from frequency domain to time domain, such as with an inverse-fast-Fourier-transform, to obtain a time domain voltage waveform at or near the workpiece.

The method may further include taking a transformed-voltage-related value, such as the RMS, peak or peak-to-peak value of the transformed RF voltage waveform at or near the workpiece.

A calibration factor may be obtained for the RF bias current by coupling the RF bias power generator to a resistive load (ideally a load resistance that matches the generator's real output impedance) and then comparing the current with the square root of the ratio of a known power output of the RF source power generator divided by the resistance value of the resistive load to determine the calibration factor of the current measurement. This calibration is done with the bias matching network disconnected or in a high-impedance state and in the absence of plasma, such that the only significant electrical load is the resistive load.

A calibration factor may be obtained for the phase between RF bias voltage and RF bias current by coupling the RF bias power generator to a load resistance that matches the generator's real output impedance, and then by measuring phase and by comparing with the zero degree phase of a resistive load. This calibration is done with the bias matching network disconnected or in a high-impedance state and in the absence of plasma, such that the only significant electrical load is the resistive load.

In a toroidal source plasma reactor wherein RF plasma source power is coupled into the interior of an external reentrant conduit of the reactor to generate a toroidal plasma current across a process region of the reactor and through the conduit, a method for measuring current of the toroidal plasma includes measuring RF current flow through the external reentrant conduit. The method may further include comparing the toroidal plasma current with a target toroidal plasma current level to produce a toroidal plasma current difference error, and changing the level of the RF plasma source power by an amount corresponding to the toroidal plasma current difference error.

In a toroidal source plasma reactor wherein RF plasma source power is coupled into the interior of an external reentrant conduit of the reactor to generate a toroidal plasma current across a process region of the reactor and through the conduit, a method for measuring current, a voltage-related value and a power-related value of the plasma includes measuring RF current flow through the external reentrant conduit, measuring RF voltage drop along an axis of the external reentrant conduit using at least two voltage probes coupled to the plasma and separated by some distance along the longitudinal axis of the conduit and determining therefrom a loop voltage of the toroidal plasma current, and determining a plasma power-related value from the RF current flow and from the RF voltage drop. The method may further include comparing the plasma power-power related value with a target power-related value level to produce a power-related value difference error, and changing the level of the RF plasma source power by an amount corresponding to the power-related value difference error.

The method can further include taking only the real part of the current flow measured along an axis of the external reentrant conduit.

The method can further include measuring phase between the current signal and one or both voltage signals to obtain a plasma power-related value using the phase between the toroidal plasma current and the plasma loop voltage. The plasma-related value may be the product cosine(phase) times toroidal plasma current times plasma loop voltage.

A calibration factor may be obtained for the RF current flow by coupling the RF source power generator to the conduit near one end thereof and coupling a resistive load to the conduit near an opposite end thereof (ideally a load resistance that matches the generator's real output impedance), and then comparing the current flow in the conduit with the square root of the ratio of a known power output of the RF source power generator divided by the resistance value of the resistive load to determine the calibration factor of the current measurement. This calibration is done with the source power applicator and/or matching network disconnected or in a high-impedance state and in the absence of plasma, such that the only significant electrical load is said resistive load.

A calibration factor may be obtained for the loop voltage by connecting each voltage probe to the conduit, comparing the measured voltage of each voltage probe with the square root of the product of a known power output of the RF source power generator multiplied by the resistance value of the resistive load, to determine the calibration factor of each voltage probe.

Wafer Current Measurements for Ion Dosimetry:

In an RF-biased plasma immersion ion implantation chamber or system, RF measurements may be used for estimating or controlling implanted ion dose. A probe (voltage/current or directional coupler) is typically positioned between the RF matching network and the electrode ("cathode"). Total current or the real part of current (product of total current and cosine of impedance angle, or quotient of absorbed bias power with respect to bias voltage, for example) may be measured directly or calculated from indirect measurements. The measured current may be the RMS (root means squared) current, the peak current or the peak-to-peak current. The measured current may be used to estimate implanted dose rate and/or dose, and if desired, to control implanted dose with time (or another variable such as source power). Also, the measured current may be used to control implant dose-rate, using a variable such as source power. In that case, implanted dose may still be controlled with time, if desired.

These features are implemented in a plasma immersion ion implantation reactor illustrated in FIG. 1. The reactor includes a vacuum chamber 100 containing a wafer support pedestal 102 for supporting or holding a semiconductor wafer 104 or workpiece and facing ceiling 106 of the chamber 100 to define a process region 108 between the ceiling 106 and the wafer 104. The ceiling 106 can include a gas distribution showerhead, including a gas distribution plate 106-1 having an array of gas outlet orifices 106-2, and a gas distribution manifold 106-3. A gas distribution system 107 furnishes selected process gases into the plenum, such process gases including a the atomic species that is to be implanted. The gas distribution system includes a flow controller 107-1 and individual gas supplies 107-2 coupled to the controller 107-1 through individual flow regulators or valves 107-3 that may be controlled by the controller 107-1. An oscillating plasma current is generated in a circulatory toroidal path passing through the process region 108 and through an external reentrant conduit 110 by an RF plasma source power applicator 112 on the conduit 110. The two open ends of the external conduit 110 are located at generally opposite sides of the process region 108. The power applicator 112 consists of a magnetic ring core 114 wrapped around the conduit 110, a coiled conductor 116 wrapped around the magnetic core 114 and an RF source power 118 generator coupled to the coiled conductor 116 through an impedance match circuit 120.

RF plasma bias power is applied to the wafer 104 from an RF plasma bias power generator 122 connected to a buried electrode 124 within the wafer support pedestal 102 through an impedance match circuit 126. One end of a coaxial transmission line 128 is connected at a bias feed point 130 to the impedance match circuit 126 and the other end of the transmission line 128 is connected to the buried electrode 124. A conventional RF probe 132 is connected between the bias feed point 130 and the impedance match circuit 126. The RF probe 132 is capable of simultaneously or nearly simultaneously measuring RF voltage, RF current and an instantaneous impedance angle between the RF voltage and RF current. The RF probe 132 may be replaced by individual instruments, specifically a voltage probe and a current probe. Moreover, while FIG. 1 illustrates the RF probe 132 (or individual voltage and current probes) as being connected at the bias feed point 130, the RF probe 132 (or individual voltage and current probes) may be connected at a measurement point displaced from the bias feed point 130.

As one optional feature, a voltage probe 132-1 coupled to the plasma and back to the RF probe 132 can be provided if it is desired to reference the measurements of the RF probe 132 to the plasma potential. In such a case, the waveform of the plasma potential sensed by the probe 132-1 inside the chamber would be subtracted from the waveform of the bias voltage sensed by the RF probe 132 at the feedpoint 130 (or other measurement point).

A processor 134 receives the instantaneous voltage, current and impedance angle data from the RF probe 132. The processor 134 may be, for example, a programmable microprocessor coupled to a memory 136 which continuously samples the output-of the RF probe at a predetermined sampling rate.

In an alternative embodiment illustrated in FIG. 1, the RF probe 132, which measures voltage, current and phase simultaneously, can be replaced by a directional coupler 132' which measures forward voltage (or current), reverse voltage (or current) and the phase angle between them. A transformer 132a transforms the forward voltage (or current), reverse voltage (or current) and the phase sensed by the directional coupler 132' to voltage, current and impedance angle (phase) measurements that are equivalent to the quantities measured by the RF probe 132. This transformation by the transformer 132a is made in accordance with a measurement point-to-wafer transform whose construction and use is described in a later portion of this specification.

The processor 134, in one embodiment, may be programmed to estimate the ion implantation dose. This may be accomplished as illustrated in the flow diagram of FIG. 2 by the processor 134 tracking the incoming stream of instantaneous current values from the RF probe 132 to construct a function I(t), namely current (I) as a function of time (t). In block 158, an optional step may be performed that will be described later in this specification, in which the instantaneous measurements from the RF probe 132 at the bias feedpoint 130 are transformed to equivalent measurements at the wafer 104 or cathode/electrode 124. The processor 132 multiplies each value of I(t) by the cosine of the impedance angle from the RF sensor 132 to obtain the real current (block 140 of FIG. 2). The real current is then multiplied by the reciprocal of the electron charge $q_e$ and the reciprocal of the cathode area A (block 142) to obtain an ion flux (number of ions per unit area per time). The processor 134 integrates this flux over time to compute a dose-related quantity, i.e., a quantity proportional to the present or instantaneous ion dose (ions per unit area) in block 144 of FIG. 2.

The dose-related quantity may be controlled by the processor 134 based upon a target dose-related quantity value entered by a user at a user interface 146. The processor 134 constantly compares (block 148) the instantaneous dose-related quantity value (from block 144) with the user's target dose-related quantity value (from block 146), and issues a stop command when the instantaneous dose-related quantity value reaches the target value.

The processor 134 may treat the measured RF current I(t) as a proportional indication of dose rate (or ion flux). Using this approach, rather than integrating the current I(t) (or before integrating it in the control loop described in the previous paragraph), the processor 134 use I(t) with or without a constant of proportionality, in some implementations. The processor 134 may implement a feedback control loop to regulate the RF plasma source power level based upon the instantaneous dose rate or ion flux value (from block 142). In this feedback control loop, the processor 134 subtracts (block 150) the instantaneous ion flux value from a target flux value entered by the user at a user interface 152 to produce an error. The processor 134 multiplies (block 154) this error by a loop gain (block 156) to produce a corrective source power level command. This command is applied to a control input of the RF source power generator 118. The control input of the generator 118 may control the generator's total output power, forward power, total current, forward current, total voltage or forward voltage.

For more accurate performance, the voltage, current and impedance angle measurements may be transformed (block 158) from the measurement location at the feedpoint 130 to the surface of the cathode 106, in accordance with a feature that is discussed later in this specification.

Ion Efficiency Factor:

The current measured by the RF probe 132 is not necessarily equal to the ion current incident on the wafer 104. This is because, at least part, there are species other than the species of interest in the plasma. To correct this, a scale factor (efficiency factor) may be calculated for a particular process condition that relates the total current or the real part of current to the actual dose rate of the species of interest on the workpiece. For example, secondary ion mass spectrometry (SIMS) may be used to determine the actual dose (product of dose rate and time) on the workpiece. A multi-dimensional lookup table, interpolation function or estimation function may be used to provide a scale factor as a function of key process variables (i.e., bias voltage, source power, pressure, gas composition and flows). From this, the process time or source power may be selected to obtain the desired dose.

Figure 3A:
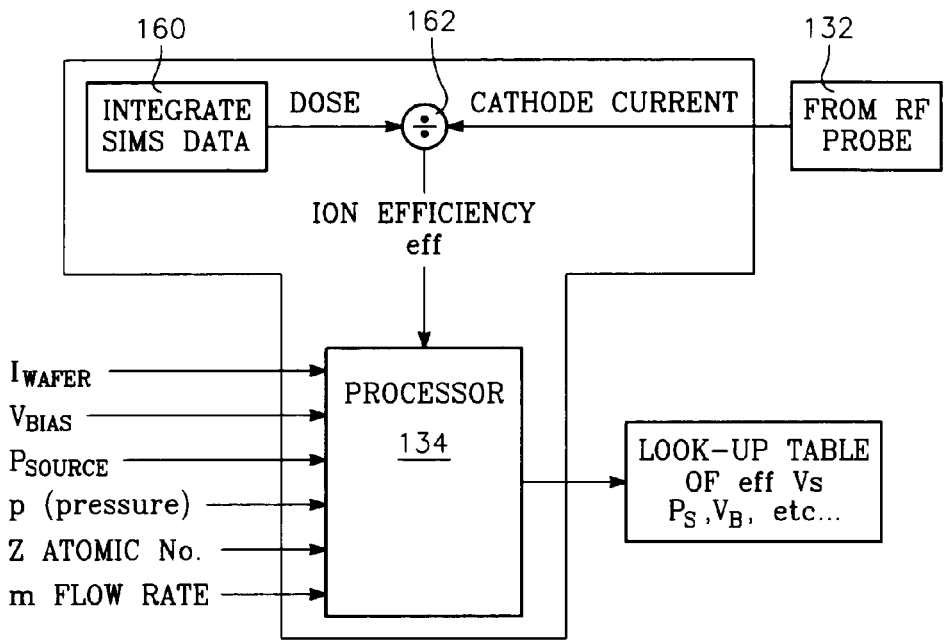
FIG. 3A depicts a process for determining an ion efficiency factor in the reactor of FIG. 1.
Figure 3B:
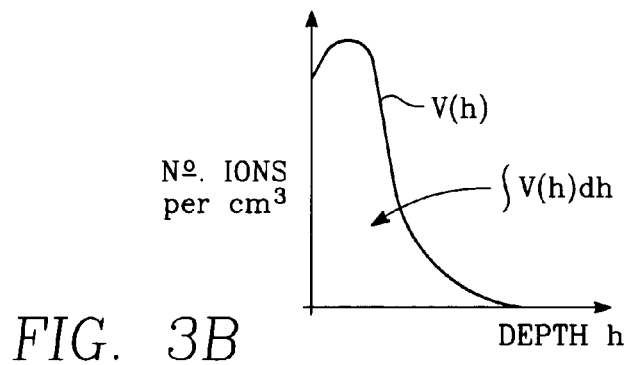
FIG. 3B is a graph depicting the integration of an ion density distribution over depth to obtain dose.
Figure 3C:
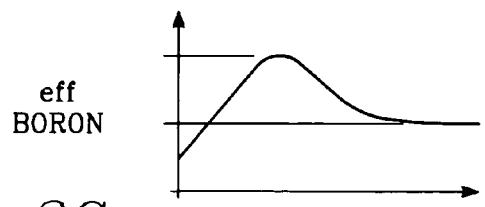
FIG. 3C is a graph depicting how ion efficiency can vary as a function of bias voltage.

These features are implemented in the construction of a look-up table by the processor 134 of FIG. 1 in the manner illustrated in FIG. 3A. Referring to FIG. 3A, during ion implantation of a test wafer in the reactor of FIG. 1, the processor 134 receives constantly updated values of current and voltage from the RF sensor 132, source power level from the RF source power generator 118 (e.g., delivered power), chamber pressure from a pressure sensor, atomic weight of the species of interest and gas flow rate of the process gas containing the species of interest (e.g., B2H6 if boron is the species of interest). In various embodiments, the processor 134 may receive some or all of these values. Upon completion of the ion implantation process, the test wafer is subject to a secondary ion emission spectrometry (SIMS) process, in which a small spot on the wafer is sputtered while a quadrapole mass spectrometer senses the secondary ion emission as a function of sputter depth, to obtain an ion implantation density distribution over depth of the species of interest. Such a distribution is illustrated in FIG. 3B and constitutes the SIMS data. The area under the curve of the distribution of FIG. 3B is the ion dose. The processor integrates the distribution of the SIMS data over depth (block 160 of FIG. 3A) to obtain an ion dose (number of ions per unit area). The processor divides (block 162) the dose from block 160 by the current from the RF probe 132 to obtain a ratio, which is the efficiency factor for the species of interest. The processor 134 then correlates this efficiency factor with each of the process condition values received by the processor 134 during the ion implantation of the test wafer (voltage, current, source power, pressure, atomic number and gas flow rate) in a look-up table. The look-up table may be stored in the memory 136 of FIG. 1. The ion efficiency factor will vary as each of the process condition values varies. For example, the ion efficiency factor for boron can vary with wafer bias voltage in the manner illustrated in the graph of FIG. 3C.

The look-up table is improved as many test wafers are implanted under many different process conditions and then used to generate SIMS data. A given test wafer is implanted under a given set of process conditions representing a point in an n-dimensional process space, in which an integral number (n) of process conditions are tracked (e.g., voltage, current, source power, pressure, etc.). For each test wafer, a corresponding location in n-dimensional process space is correlated in the look-up table to the ion efficiency factor deduced from the SIMS data obtained from that test wafer (i.e., from block 162 of FIG. 3A). After many points in the n-dimensional process space have been correlated to ion efficiency values in the look-up table, an ion efficiency factor may be determined during implantation of a production wafer from the n process conditions then prevailing, defining an actual location in the n-dimensional process space. If this actual location does not precisely match a location for which the look-up table provides a corresponding efficiency factor, then an efficiency factor is determined by conventional interpolation among at least two of the nearest locations for which the look-up table does provide ion efficiency factors.

Figure 2:
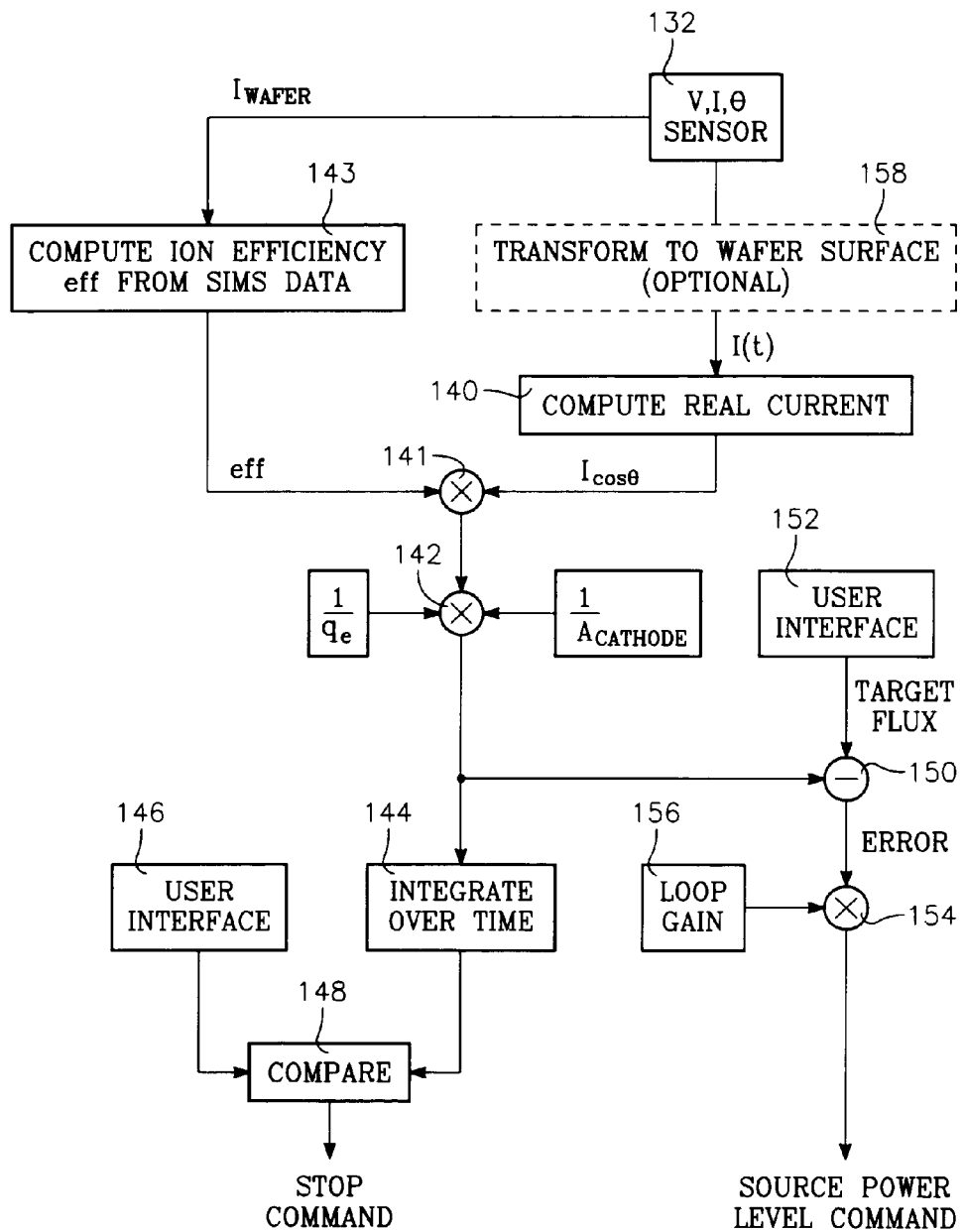
FIG. 2 depicts a method of measuring ion implantation dose.

The foregoing process for determining the ion efficiency factor corresponds to the step of block 143 of FIG. 2. The current is multiplied by the ion efficiency factor in the step of block 141.

The steps of blocks 140, 142 and 143 are multiplication operations while the step of block 144 is an integration step. The order in which these steps are performed may be changed from that depicted in FIG. 2 and described above. For example, all of the multiplication steps (140, 142, 143) may be performed after the integration step, or the integration step may be performed before all of the multiplication steps, or some of the multiplication steps may be performed before the integration step and the remaining ones thereafter.

Wafer Voltage Measurements for Ion Energy Control:

Voltage measurement (directly measured at the bias feedpoint or calculated from indirect measurements) may be used to estimate ion energy (for display to the user), and if desired, to control ion energy and/or implant depth with RF plasma bias voltage or power.

Figure 4A:
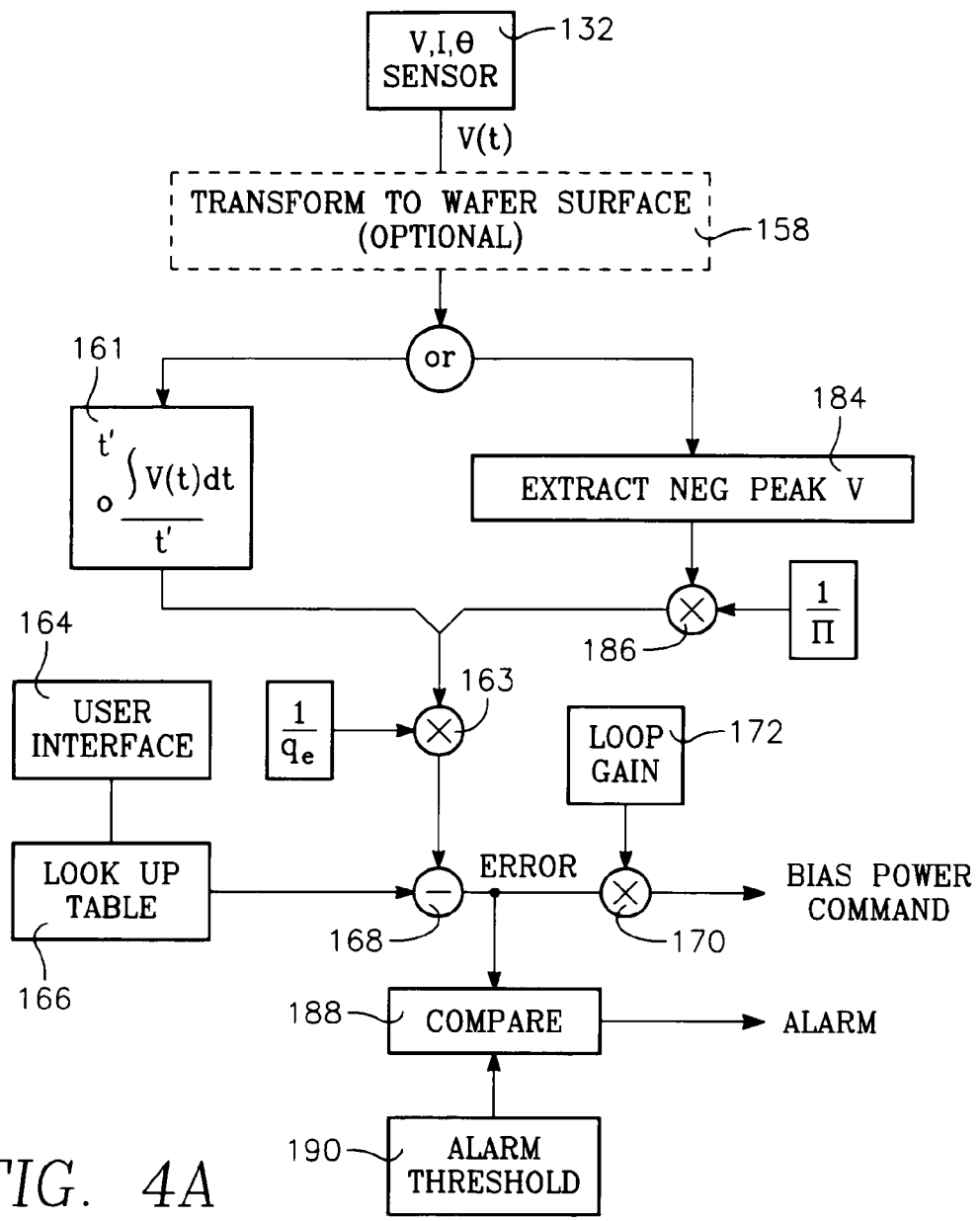
FIG. 4A depicts a method of measuring ion energy in the reactor of FIG. 1.

This feature is implemented by the processor 134 of FIG. 1 in the manner illustrated in FIG. 4A. The voltage sensed at the bias feedpoint 130 by the RF probe 132 is sampled by the processor 134 periodically and stored, to form a time domain function V(t) of the measured voltage. The feedpoint voltage V(t) may be transformed to the corresponding voltage at the wafer in the optional step of block 158, as will be described below in this specification. The processor 134 integrates the voltage V(t) over a predetermined time period t' and divides the result by the time period t' (block 161) to produce an average or D.C. voltage. This D.C. voltage is then multiplied (block 163) by the electron charge $q_e$, to compute the ion energy E. Alternatively, the peak ion energy may be computed from the peak voltage (V(t), based on a known correlation between voltage and energy. For example, in one embodiment, at low-bias frequency where ion inertia across the workpiece plasma sheath can be neglected, it is known that the peak ion energy corresponds to the peak-to-peak value of the voltage V(t).

For feedback control of the ion energy, the user may enter a desired ion implantation depth at a user interface 164. A look-up table 166 may convert the desired depth to a target ion energy for the selected atomic species. The processor 134 subtracts the measured ion energy E from the target energy (block 168) to produce an error. The processor 134 multiplies (block 170) the error by a loop gain 172 to produce a bias power correction command, which is sent to a control input of the RF bias power generator 122 of FIG. 1. The control input of the generator 122 may control the generator's total output power, forward power, current, forward current, voltage or forward voltage. The controlled quantity may be either wafer bias voltage, ion energy or ion implant depth. Conversions among these three quantities may be obtained from a predetermined data base.

Alternatively, the processor 134 may compare (block 188) the error computed in the subtraction step of block 168 with a predetermined error threshold (block 190) and issue an alarm if the threshold is exceeded.

Figure 4B:
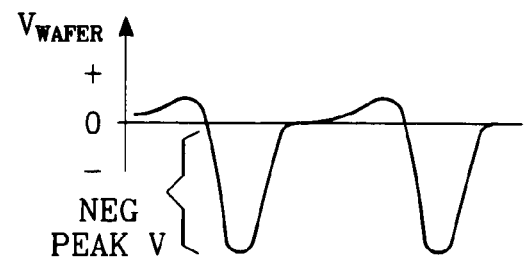
FIG. 4B is a graph depicting a typical bias voltage time domain waveform.

The voltage V(t) measured by the RF probe at the feedpoint 132 and transformed to the wafer plane may have the time domain waveform of FIG. 4B. In this case, the voltage waveform is roughly equivalent to a negative half-wave rectified sinusoid. In such a case, the average voltage is approximately the negative peak voltage divided by 3.14. Therefore, the integration step of block 161 may be replaced by the step of block 184 in which the negative peak voltage of V(t) is first determined and then this value is divided by 3.14 (block 186). Alternatively, the negative peak or the peak-to-peak value of V(t) is used.

While FIG. 4A illustrates an implementation in which the user's target implant depth is converted to an ion energy for comparison with the measured ion energy, the control loop of FIG. 4A could instead be implemented by converting the measured ion energy to a measured implant depth using the same look-up table in reverse, and compare the measured and target ion implant depth to generate a feedback command signal.

Wafer Voltage Measurements for Wafer Temperature Control:

In an electrostatic chuck that cools the wafer by direct high clamping force contact, the RF wafer voltage measurement may used to control (open or closed loop) electrostatic clamping voltage. Through this clamping voltage, the wafer clamping force or pressure can be controlled to control workpiece temperature, maximum workpiece temperature, or workpiece rate-of-change of temperature. Typically a net clamping voltage is controlled. The net clamping voltage is the difference between the RF-induced DC bias on the workpiece (the time-average voltage for a process step) and the average voltage applied or measured on the electrostatic chuck chucking electrode. A circuit or algorithm may be used to determine, calculate or convert the RF voltage to an estimate of the time-average workpiece voltage.

Figure 5:
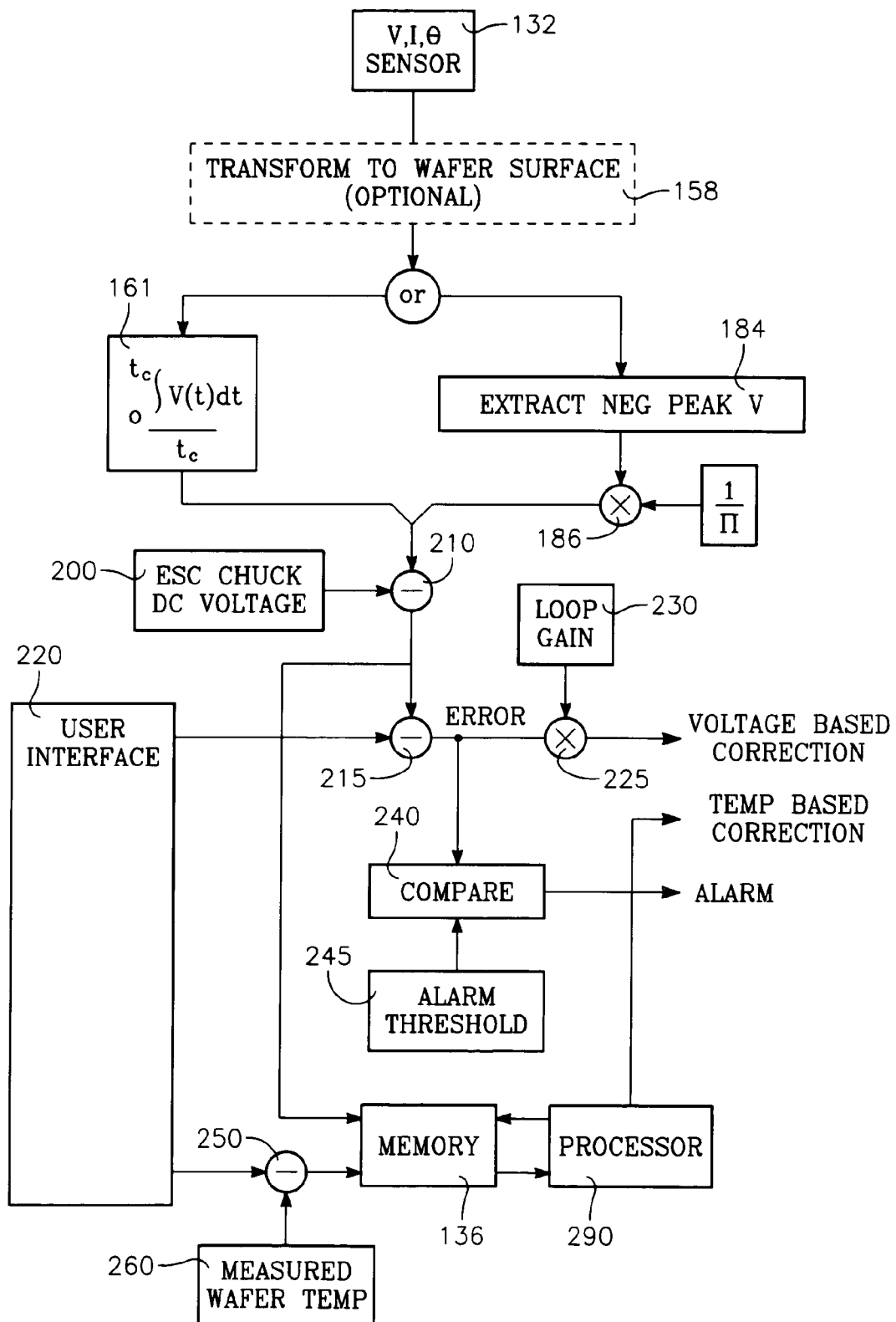
FIG. 5 depicts a method for measuring clamping voltage in an electrostatic chuck of the reactor of FIG. 1.

These features are implemented by the processor 134 of FIG. 1 in the manner illustrated in FIG. 5. As shown in FIG. 1, the wafer support pedestal 102 is an electrostatic chuck (ESC) in which the buried electrode 124 has a D.C. chucking voltage applied to it by a D.C. ESC chuck voltage source 200. A D.C. isolation capacitor (not shown) may be provided at the output of the impedance match circuit 126. Referring to FIG. 5, the processor 134 determines the average or D.C. wafer voltage in the same manner as FIG. 4A using the steps or elements of blocks 132, 158 and either 161 or 184 and 186 in the manner described above with reference to FIG. 4A. The measured D.C. wafer voltage is subtracted (block 210) from the D.C. chucking voltage applied by the ESC voltage source 200 to compute a net clamping voltage. A subtractor 215 subtracts the clamping voltage from a target clamping voltage entered by the user at a user interface 220 to produce an error value. A multiplier 225 multiplies the error value by a loop gain 230 to produce a correction command that is sent to the ESC D.C. voltage source 200.

Alternatively, the error from the subtractor 215 may be compared (block 240) with a predetermined error threshold (block 245) and an alarm is issued at the user interface 220 whenever the threshold is exceeded.

In one embodiment, the wafer support pedestal is an electrostatic chuck (ESC) of the type disclosed in U.S. patent application Ser. No. 10/929,104, filed Aug. 26, 2004 entitled GASLESS HIGH VOLTAGE HIGH CONTACT FORCE WAFER CONTACT-COOLING ELECTROSTATIC CHUCK by Douglas Buchberger Jr., et al. and assigned to the present assignee, the disclosure of which is incorporated herein by reference in its entirety. In this type of ESC, the wafer is cooled by direct contact with the cathode under very high clamping force. The rate of cooling is controlled by the clamping force. When employing this type of ESC in the present invention, the user merely specifies the desired wafer temperature and the control loop changes the clamping force (by changing the D.C. ESC clamping voltage) to maintain the specified wafer temperature.

In carrying out this feature, the processor 134 operates as follows. First, the net clamping voltage on the wafer is produced at the output of the subtraction step of block 210 in the manner described above. A user-entered target wafer temperature from the user interface 220 is subtracted (block 250) from the measured wafer temperature obtained (block 260) from a temperature probe 260 shown in FIG. 1, which may be a fluoroscopic probe, pyrometric probe, or other temperature probe. This produces a temperature error value. Previous samples as well as the current sample of the net clamping voltage (from the subtraction operation of block 210) are stored in a memory such as the processor memory 136. The processor 134 responds to the temperature error value by determining (block 290) the optimal correction to the ESC D.C. voltage to minimize the error. This determination is made using conventional techniques based upon the error signal and based upon the history of the clamping voltage stored in the memory 136. The resulting correction signal is applied to a control input of the D.C. ESC voltage source 200.

The simplest method for determining the correction to the ESC D.C. voltage in block 290 is to increase the ESC D.C. voltage by a predetermined amount whenever the wafer temperature exceeds the target temperature, and to decrease the ESC D.C. voltage by the predetermined amount whenever the wafer temperature is less than the target temperature. The processor 134 repetitively samples the wafer temperature and repeats the foregoing operation with each sample. In this simple implementation, correction of a large temperature error may require many cycles of the control loop producing successive increases (or decreases) of the ESC D.C. voltage. Other methods for determining the correction to the ESC D.C. voltage in block 290 may be employed for carrying out the invention.

An additional feature may be realized by programming the processor 134 to compare (block 310) the temperature error with a predetermined temperature threshold (block 320) and to issue an alarm (e.g., to the user interface 220) whenever the threshold is exceeded.

Transforming Measurements at the Feedpoint to the Cathode:

In the foregoing descriptions of FIGS. 2, 4A and 5, reference was made to an optional step of block 158 for transforming the RF probe current or voltage measurements at the bias feedpoint 130 (or another nearby measurement point) up to the wafer 104 using a measurement-point-to-wafer transform. The purpose of such a transformation is to gain more accurate determination of the current and voltage at the wafer 104. Generally, the RF probe 132 may be positioned at any location between the RF impedance matching network 126 and the electrode ("cathode"), although the most practical location is felt to be the bias feedpoint 130 at the boundary of the chamber 100. The voltage, current and other parameters at the workpiece may be by applying the transform to the measurements taken by the RF probe (at the feedpoint 130 or at any point between the RF matching network and the electrode or cathode 124). The response of a two port hybrid network model may used as the transform. Typically, the transform is combined in the frequency domain with the RF probe measurements to compute equivalent voltage, current and phase values at the workpiece or cathode. This may be done with just the fundamental, or preferably with the fundamental and significant harmonics (with correct phasing). Preferably the fundamental and all significant harmonics are measured (i.e., the fundamental, second, third and fourth harmonics), more preferably with correct phasing between fundamental and all significant harmonic terms. This allows reconstruction of the time domain voltage and current waveforms at the workpiece.

Typically, the network model is generated using conventional techniques, for example by measuring input impedance-related quantities at the position of the RF probe, with the cathode terminated by (a) open circuit and then (b) short circuit. The input impedance-related quantities may be the open and short-circuit input impedance, or the open and short-circuit input admittance or the open and short-circuit RF voltage, RF current and phase at the measurement point. Then the equivalent circuit elements of the cathode may be readily determined using techniques well known in the art. From this, a two-port hybrid circuit model with a given transfer function is calculated as is well known in the art, with the input port as the RF probe position and the output as the wafer 104. The transfer function generated as above is used to transform the frequency domain spectra of measurements made at the probe location to a new spectra at the workpiece. Then, if desired, a technique such as (for example) an inverse fast Fourier transform (FFT), may be used to construct the time domain voltage and current waveforms at the cathode workpiece. This calculation may be automated for real-time display, operation, control, monitoring or data logging. The results or measurements thus generated may be monitored to ensure that the process stays within limits, and the processor 134 may issue a warning or alarm if the limits are exceeded. Preferably, only the fundamental and harmonics up to the fourth harmonic are used. Therefore, the same terms (fundamental and harmonics 1 through 4) must be measured at the measurement point. In transforming the current measured at the measurement point, the voltage must also be measured at the measurement point. If the measurements are taken in the time domain, then they are transformed to the frequency domain to obtain at least the fundamental and harmonics 2-4 (for example). These frequency domain components of the measured voltage and current are combined with the transform or transfer function to obtain the frequency domain voltage or current (or both) at the wafer plane.

Figure 6A:
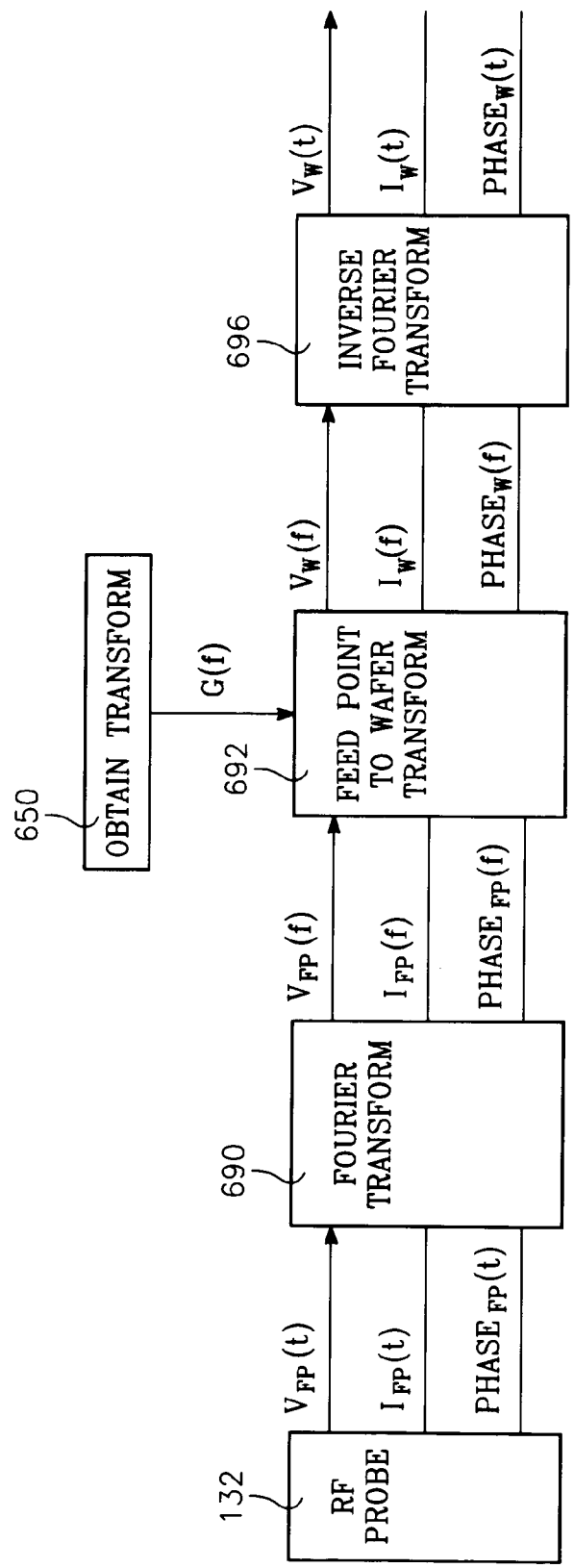
FIG. 6A depicts a process for transforming feedpoint measurements to the wafer.
Figure 6B:
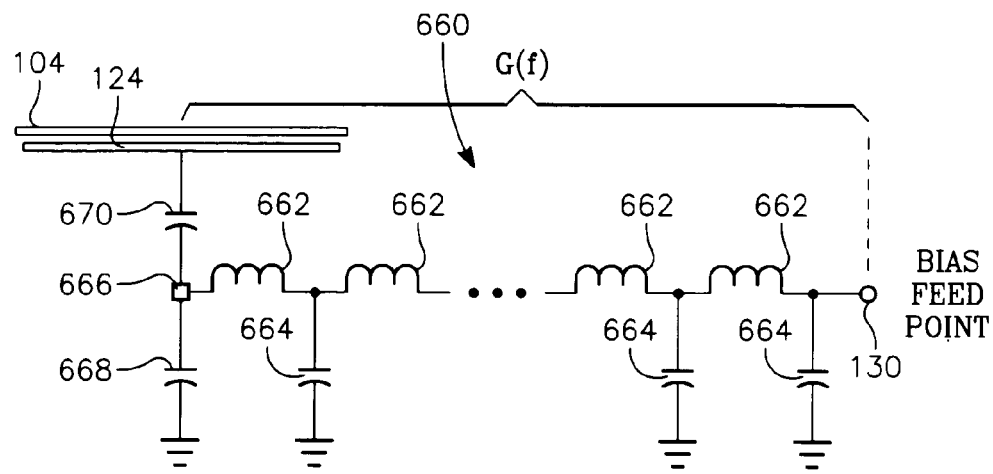
FIG. 6B depicts a model two-port hybrid network corresponding to the transformation of FIG. 6A.
Figure 6C:
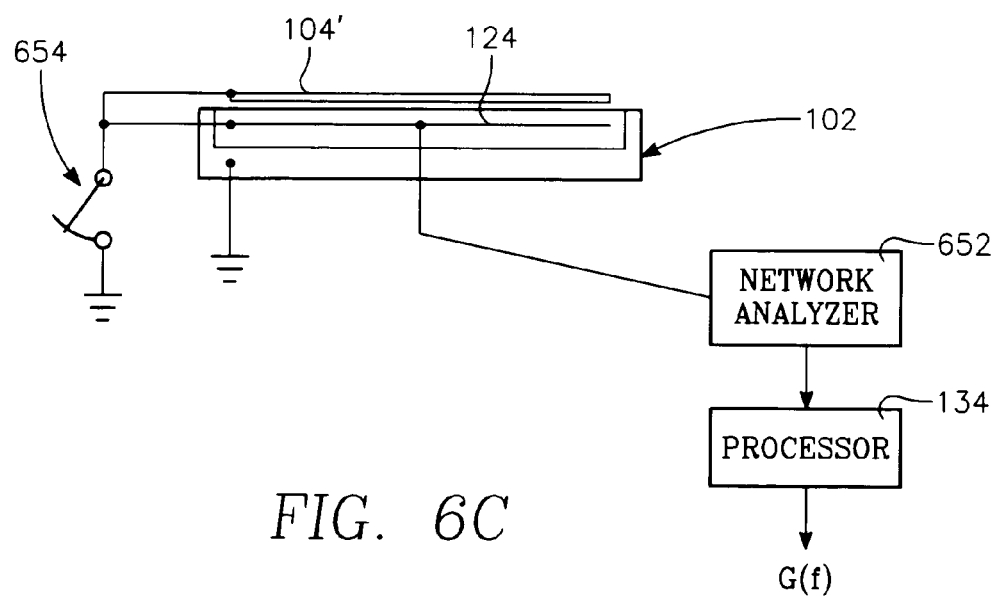
FIG. 6C is a schematic diagram depicting how the transformation is determined.

The foregoing features are implemented in the manner illustrated in FIG. 6A. First, in block 650 of FIG. 6A, a hybrid network model of the type illustrated in FIG. 6B is obtained, using the procedure depicted in FIG. 6C. This procedure entails the connection of a conventional network analyzer 652 to the feedpoint 130. The network analyzer 652 generates data characterizing the impedance (or admittance) at the feedpoint 130, which data can be received by the processor 134 and stored in the memory 136 (or by another external processor and memory, if desired). A first set of impedance or admittance data is obtained with a test wafer 104' (or, alternatively, the cathode electrode 124) open (unconnected) and then a second set of impedance or admittance data is obtained with the test wafer (or, alternatively, the cathode electrode 124) shorted via a very low-impedance connection to ground by a switch 654, for example. The processor 134 (or other computer) processes the two sets of impedance or admittance data in a conventional manner to produce a measurement point-to-wafer transform G(f) that corresponds to the two-port hybrid network model illustrated in FIG. 6B.

Referring now to FIG. 6B, the network model representing G(f) has three external points to which it is connected, namely the bias feedpoint 130 (or another measurement point) at one end, the test wafer (or, alternatively, the cathode electrode 124) at the other end, and RF ground. The coaxial transmission line 128 corresponds to a lumped element circuit 660 consisting of load inductors 662 of inductance L and shunt capacitors 664 of capacitance C. The lumped element circuit 660 is terminated at a node 666 (corresponding to the cathode electrode 124) between a first capacitor 668 representing the capacitance of the cathode electrode 124 to ground and a second capacitor 670 representing the capacitance between the cathode electrode 124 and the wafer 104. The frequency response or transfer function G(f) of the network model circuit of FIG. 6B is calculated (from the open and short network analyzer data referred to above) and stored in the memory 136 of FIG. 1, so that it is available to the processor 134 of FIG. 1 during production operations. The processor 134 performs a Fourier transform (block 690) upon some or all of the quantities (voltage, current, phase) measured at the feedpoint 130 by the RF probe 132 to obtain frequency domain versions of these quantities. These frequency domain entities are then convolved (block 692) with the measurement point-to-wafer transform G(f) to produce equivalent frequency domain measurements at the wafer 104. The processor 134 performs an inverse Fourier transform (block 696 of FIG. 6A) of these frequency domain measurements to obtain the time domain waveforms of the measurements (voltage, current and phase angle) as they would have appeared at the wafer 104. This completes the transformation step of block 158 employed in the processor operations depicted in FIGS. 2, 4A and 5. The time domain voltage or current at the wafer may be obtained in this way, and its RMS (root means square), peak or peak-to-peak value may be obtained.

A principal advantage of performing the measurement point-to-wafer transformation of the RF probe measurements is that the transformed measurements more accurately reflect the voltage and current at the wafer surface. Therefore, in carrying out the processes of FIGS. 2, 4 and 5 for obtaining measurements at the wafer, more accurate results are obtained.

Measurements in a Toroidal Source Reactor:

An RF probe may be used to measure induced plasma current in a toroidal plasma source of the type illustrated in FIG. 1. This is preferable to simply measuring current, voltage, or power, for example, at the power applicator, RF coil, input port or RF match. This is because the RF probe measurement can capture the entire current through the external reentrant conduit 110 and therefore is unambiguous with respect to losses (such as in coils, capacitors, ferrite cores, eddy currents in nearby non-insulating materials, etc). Typically the probe takes the form of a current transformer (which may be electrostatically shielded) surrounding the external reentrant conduit 110 within which the toroidal plasma current oscillates. Voltage pickups may be used at two or more locations in the toroidal path, typically at two spaced-apart locations on the reentrant conduit 110. The voltage probes may measure the potential on the conduit at that position or may measure the potential of the plasma at that position. The voltage probes may be DC or RF (or both) coupled to the conduit's conductive surface or to the plasma within the conduit. Preferably a differential voltage measurement is made of the two (or more) voltage pickups. For best results, a differential probe with a high common-mode-rejection-ratio is used. This potential difference is proportional to the total induced loop voltage around the closed path of the oscillating toroidal plasma current. An effective electric field may be calculated using the difference voltage, the effective spacing between voltage pickups, and the total effective toroidal loop length. The power absorbed by the plasma from the source generator is proportional to the product of the toroidal plasma current, the induced loop voltage and the cosine of the impedance angle between them. A control system may be employed to control RF generator power, current or voltage based on the induced toroidal plasma current, the toroidal loop voltage (or difference voltage) or a combination or derivation thereof. Alternatively, the control system may control another parameter (such as generator delivered power or generator forward power). Furthermore, it may monitor or log the induced toroidal plasma current, the toroidal loop voltage (or difference voltage) or a combination thereof or derivation thereof to ensure that the process stays within limits, then issue a warning or fault if not.

Figure 7:
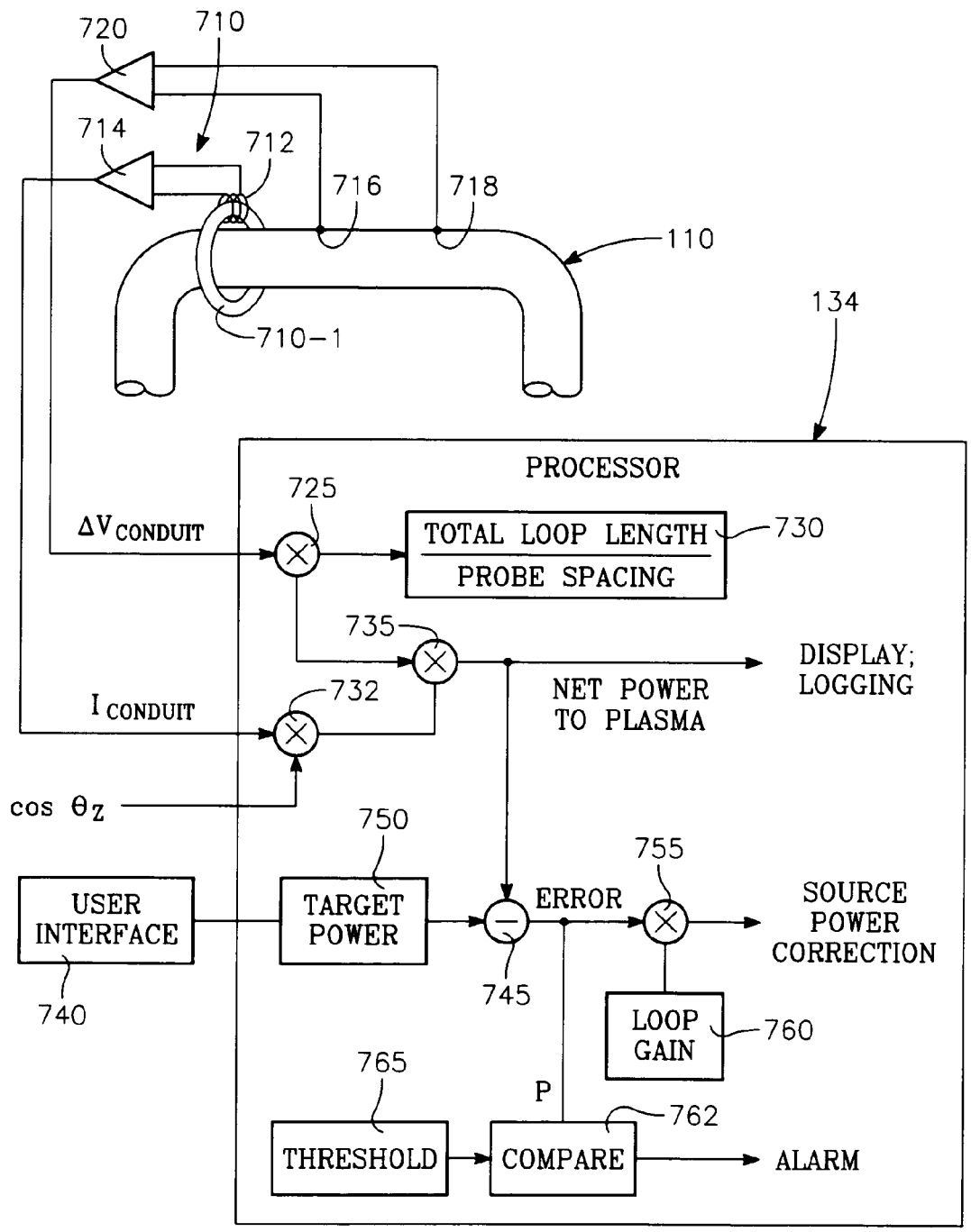
FIG. 7 depicts elements of the reactor of FIG. 1 for measuring plasma current, voltage and power in a toroidal plasma source.

FIG. 7 depicts the manner in which the foregoing features are implemented in the reactor of FIG. 1. A current probe 710 (shown in both FIGS. 1 and 7) typically consists of a ferrite core 710-1 encircling the reentrant conduit 110 with a conductive coil 712 wrapped around the ferrite core and terminated in a resistance, and a differential voltage sensor 714 (which may be a resistor or a differential amplifier) connected across the coil 712 whose output represents the total plasma current through the conduit 110. By providing such a current probe for all conduits of the reactor, the total plasma current may be measured. A pair of voltage probes 716, 718, which may be either RF probes or D.C. probes, sense voltage at two different points along the axis of the reentrant conduit 110. The voltage probes 716, 718 may detect either the voltage on the surface of the conduit 110 or the voltage of the plasma in the interior of the conduit 110. The voltage difference between their outputs is sensed by a differential amplifier 720 (for example) to provide a voltage drop. The processor 134 multiplies (block 725) this voltage drop by the ratio (block 732) of the total toroidal plasma current loop length divided by the spacing between the probes 716, 718. This determines the voltage of the toroidal plasma current. The real part of the plasma current is obtained by multiplying (block 730) the current value output by the probe 710 by the cosine of the impedance angle between the loop voltage (from the multiplication step of block 725) and the current (from the current probe 710). The impedance phase angle may be inferred by the processor 134 from the time domain waveforms of the voltage and current using conventional techniques. The real part of the current is then multiplied (block 735) by the loop voltage to produce total power delivered to the plasma.

Feedback control of the plasma source power may be performed based upon a target source power level input by the user at a user interface 740. The processor 134 subtracts (block 745) the target source power value (block 750) from the measured power to obtain a source power error value. This source power error value is multiplied (block 755) by a loop gain (block 762) to produce a source power correction command which is applied to a control input of the RF plasma source power generator 118 of FIG. 1. The control input may govern RF generator forward (delivered) power, current or voltage. Alternatively, the processor 134 may compare (block 760) the source power error value with a predetermined threshold value (block 765) and issue an alarm at the user interface 740 whenever the error exceeds the threshold. The threshold value 765 may be a constant user-specified value or else it may be constructed from a running average of source power errors.

Mass Distribution:

The RF probe(s) may be used in conjunction with a species-sensing probe 50 and sensor 50-1 shown in FIG. 1, which may be a residual gas analyzer (RGA) or an optical emission spectrometer (OES). For example, the bias probe is used in addition to an RGA. The RF probe provides information on total current and/or real part of current to workpiece, while the RGA provides information on mass distribution. An RGA may be used without a filament, such that only ions from the plasma are measured. One such probe is made by Hiden: an energy filtered quadrapole mass spectrometer.

In-Situ Calibration of Source Measurements:

Diagnostics may be implemented with in-situ calibration capability, using the RF generator (which is normally carefully calibrated). For example, on a process chamber that has one or more toroidal plasma sources, high voltage relays may be used (for each toroidal source) to electrically connect one end the reentrant conduit tube to the RF generator output (and the RF generator output is disconnected from source power applicator) and the other end of the reentrant conduit tube to a load, preferably a 50 ohm resistive dummy load that matches the output impedance of the RF generator. The dummy load may be a small liquid-cooled type (commercially available) that is installed locally at the plasma source under the cover. Then the RF generator may be used to calibrate the toroidal source current probe against the RF generator power meter (current=square root of power/resistance for a purely resistive load). If a long RF cable is used, then the cable loss (a known published value) should preferably be taken into account. Alternatively, a power measurement at the dummy load would provide the most accurate calibration. Software may automatically operate the relays to route the RF generator output through the reentrant conduit tube to the dummy load. Software may automatically vary the RF generator power output and measure the current response through the reentrant conduit tube as a function of the absorbed power. Then software may calculate a calibration factor for the probe which can be used for all subsequent measurements. After the calibration, software directs the relays to switch the RF generator output from the reentrant conduit tube back to the source power applicator, and disconnect the dummy load from the reentrant conduit tube. The benefit of the in-situ calibration is that it not only compensates for unit-to-unit variation in current transformers, but also compensates for geometric effects (non-centered current path through current transformer, effects of bends of conduit, effects of nearby conductors, semiconductors or lossy insulators).

Figure 8A:
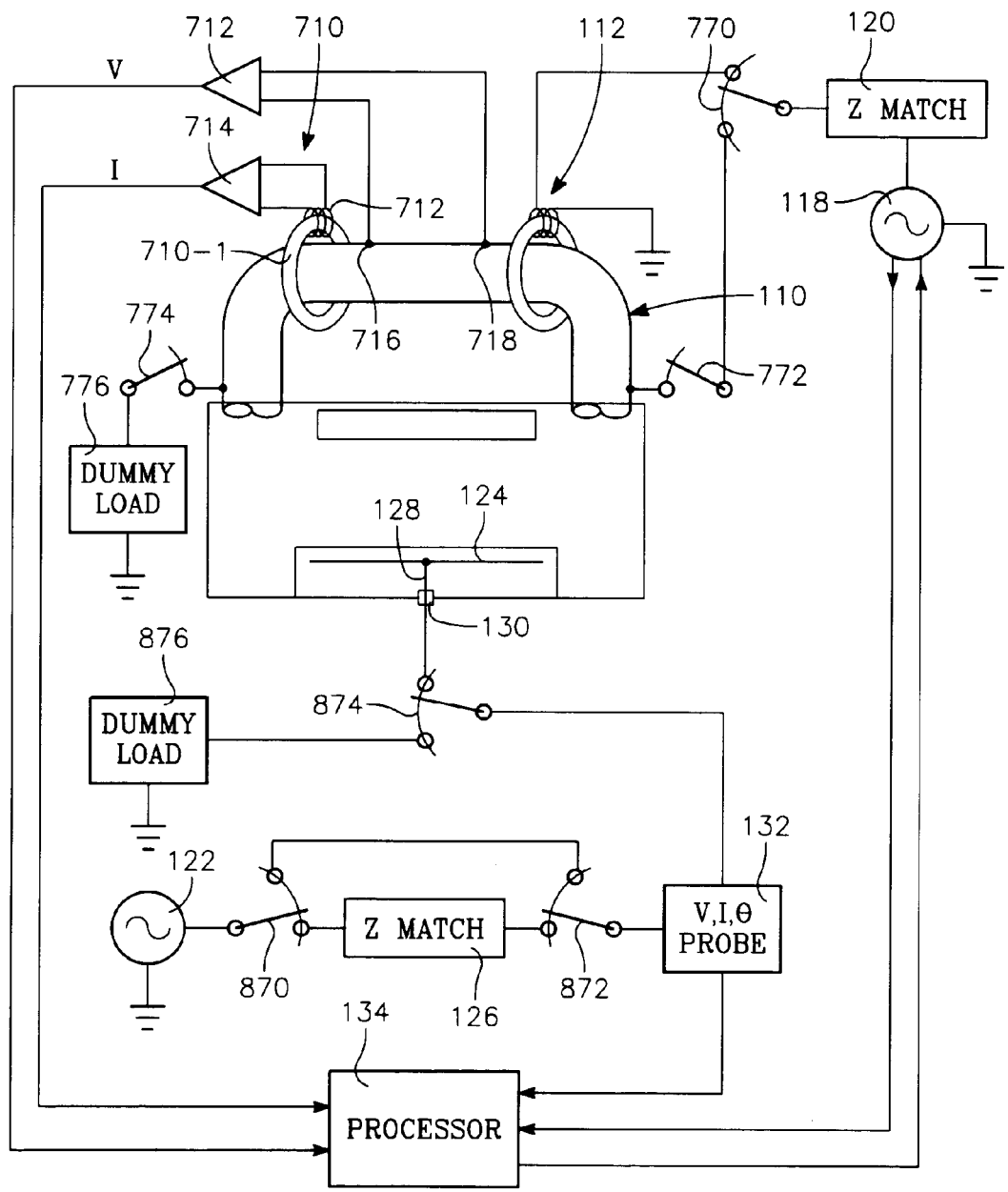
FIG. 8A depicts modifications to the apparatus of FIG. 7 for calibrating voltage and current measurements.

The foregoing features are implemented by the processor 134 in the manner illustrated in FIG. 8A. In order to calibrate the toroidal source voltage and current probes of FIG. 7, the voltage and current measurements are calibrated against the delivered power that is precisely metered at the source power generator 118. Calibration is facilitated by high voltage switches 770, 772, 774 capable of temporarily disconnecting the source power generator 118 from the power applicator 112 and connecting it instead across a series combination of the reentrant conduit 110 and a purely resistive dummy load 776. The switches 770, 772, 774 return the reactor to the configuration of FIG. 1 at the conclusion of the calibration process, which will now be described.

Figure 8B:
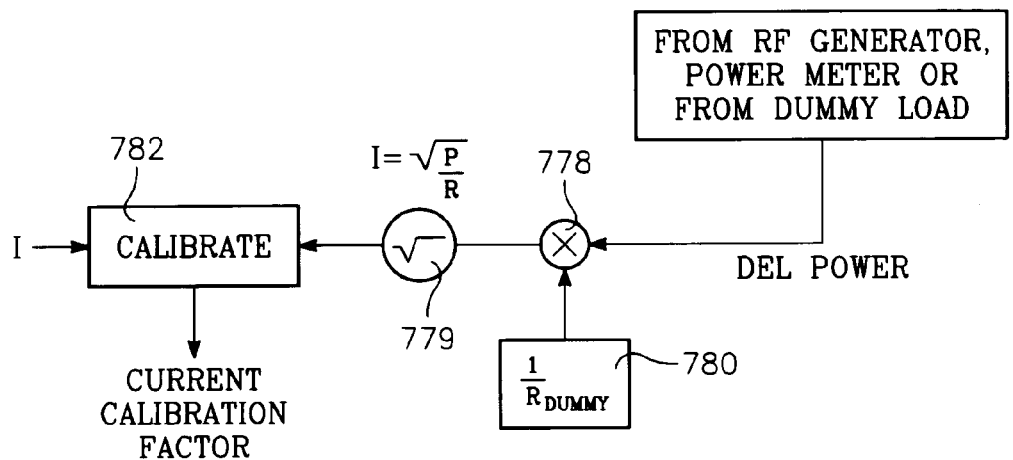
FIG. 8B depicts the process by which the apparatus of FIG. 8A calibrates the current measurement.

Referring to FIG. 8B, the processor 134 multiplies (at block 778) the delivered or forward power level measured at the RF generator 118 by the reciprocal of the resistance (block 780) of the dummy load 776 and computes the square root of the result (block 779) to produce the actual delivered current to the plasma. The processor 134 receives the real part of the RF probe-measured current through the conduit 110 from the multiplication step 735 of FIG. 7. The processor 134 computes (block 782) a calibration correction factor by comparing (e.g., computing the ratio of) the two current values. This calibration factor is stored in the memory 136 of FIG. 1 and used to correct all measurements obtained from the current probe 710.

Figure 8C:
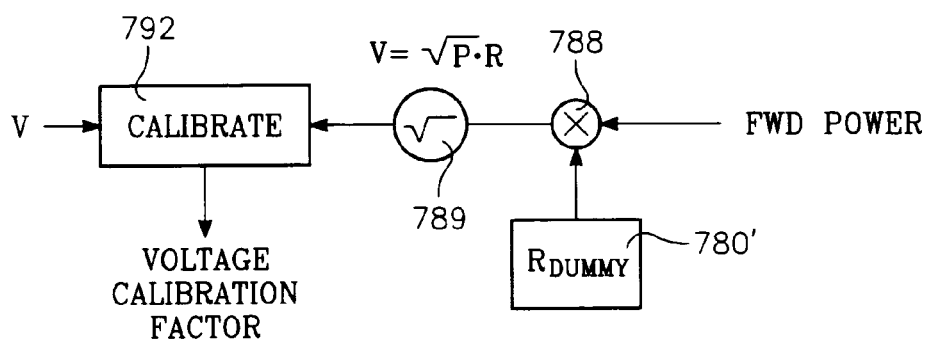
FIG. 8C depicts the process by which the apparatus of FIG. 8A calibrates the voltage measurement.

Referring to FIG. 8C, the processor 134 multiplies (block 788) the delivered or forward power level measured at the RF generator 118 by the resistance (block 780') of the purely resistive dummy load 776 and takes the square root of the result (block 789) to produce the actual voltage delivered to the plasma. For each one of the voltage probes 716, 718, the processor 134 compares (block 791) the probe's measured voltage with the actual voltage computed in the step of block 789. The processor 134 computes (block 792) a calibration correction factor for the individual voltage probe 716 by comparing the two voltage values. This calibration factor is stored in the memory 136 of FIG. 1 and used to correct all measurements obtained from the particular voltage probe 716. The identical procedure is followed to obtain a calibration factor for the other voltage probe 718.

In-Situ Calibration of Bias Measurements:

Similarly, measurements of RF current, RF voltage or phase (impedance angle) at the measurement point (which may be the feedpoint 130) may be implemented with in-situ calibration capability (preferred), using the RF bias power generator 122 of FIG. 1 (which is normally carefully calibrated). For example, on a process chamber that has a biased electrode, a high voltage relay may be used to electrically connect an RF generator output to the input port of the RF probe (voltage, current and phase probe, or directional coupler). A second high voltage relay may be used to connect the output port of the RF probe to (preferably) a 50 ohm resistive dummy load that matches the output impedance of the RF generator. The dummy load may be a small liquid-cooled type (commercially available) that is installed locally at the chamber or RF matching network. Then the RF generator may be used to calibrate the RF probe against the RF generator power meter, using the following relationships: current=square root of power/resistance, voltage=square root of power/resistance for a purely resistive load, cosine of the phase angle=1 for purely resistive load. If a long RF cable is used, then the cable loss (a known published value) should preferably be taken into account. Alternatively, a power measurement at the dummy load would provide the most accurate calibration. Software may automatically operate the relays to route the RF generator output through the RF probe to the dummy load. Software may automatically vary the RF generator power output and measure the probe response (voltage, current and phase) distribution over the absorbed power. Then software may calculate calibration factors (for each of V, I, and phase) for the probe which can be used for all subsequent measurements. After the calibration, software directs the relays to switch the RF generator output from the RF probe input port back to the RF match input port, and switch the RF probe output port from the dummy load back to the chamber RF bias input port. Note that although a voltage, current and phase probe is described above, alternatively a directional coupler could be used.

The foregoing features are implemented by the processor 134 in the manner illustrated in FIG. 8A. In order to calibrate measurements from the bias measurement point RF probe 132, its voltage, current and impedance angle measurements are compared against the delivered power metered at the bias power generator 122. Calibration is facilitated by high voltage switches 870, 872, 874 capable of temporarily disconnecting the bias power generator 122 from the input of the impedance match circuit 126 and disconnecting the RF probe 126 from the coaxial conductor 128 and connecting the bias generator 122 instead across a series combination of the RF probe and a purely resistive dummy load 876 matching the output impedance of the generator 122. The switches 870, 872, 874 return the reactor to the configuration of FIG. 1 at the conclusion of the calibration process, which will now be described. In this way, the calibration is performed with the bias matching network disconnected or in a high-impedance state and in the absence of plasma, so that the only significant load is the resistive load 876.

Referring to FIG. 8B, the processor 134 multiplies (block 778) the delivered or forward power level measured at the bias RF power generator 122 by the reciprocal of the resistance (block 780) of the dummy load 876 and computes the square root of the result (block 779) to produce the actual delivered current to the plasma. The processor 134 receives the measured current from the RF probe 132. The processor 134 computes (block 782) a calibration correction factor by comparing the two current values. This calibration factor is stored in the memory 136 of FIG. 1 and used to correct all current measurements obtained from the RF probe 132. As one option, the processor 134 may command the generator 122 to ramp its RF power level across a predetermined range, while the processor 134 computes current calibration correction factors for many different power values across the range and stores them in memory. In this case, the calibration factor applied by the processor 134 to an actual current measurement depends upon the power level of the generator.

Referring to FIG. 8C, the processor 134 multiplies (block 788) the delivered or forward power level measured at the RF bias power generator 122 by the resistance (block 780) of the dummy load 876 and takes the square root of the result (block 789) to produce the actual delivered voltage current to the plasma. The processor 134 receives the voltage measurement from the RF probe 132. The processor 134 computes (block 792) a calibration correction factor by comparing the two voltage values. This calibration factor is stored in the memory 136 of FIG. 1 and used to correct all voltage measurements obtained from the RF probe 132. As one option, the processor 134 may command the generator 122 to ramp its RF power level across a predetermined range, while the processor 134 computes voltage calibration correction factors for many different power values across the range and stores them in memory. In this case, the calibration factor applied by the processor 134 to an actual voltage measurement depends upon the power level of the generator.

A calibration factor may be obtained for the phase between RF bias voltage and RF bias current by coupling the RF bias power generator to a load resistance that matches the generator's real output impedance, and then by measuring phase and by comparing with the zero degree phase of a resistive load. This calibration is done with the bias matching network disconnected or in a high-impedance state and in the absence of plasma, such that the only significant electrical load is said resistive load.

Figure 9A:
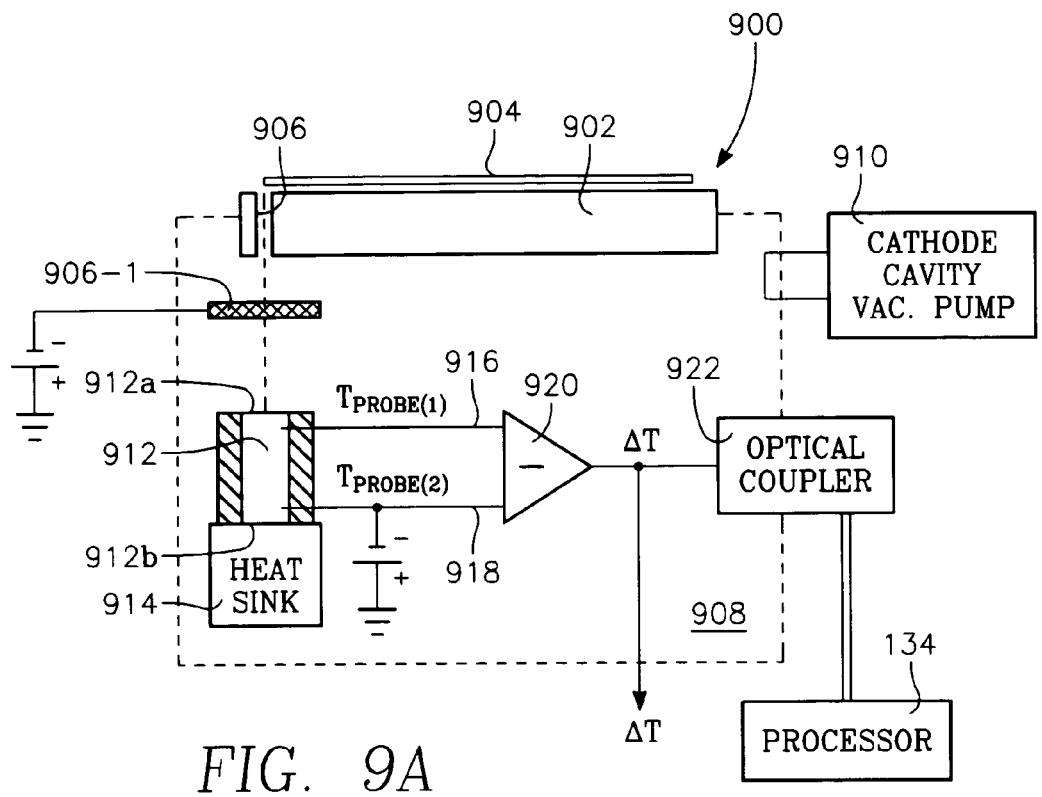
FIG. 9A illustrates a wafer support pedestal capable of thermally measuring ion implantation dose.

Thermal Measurements of Ion Dose:

FIG. 9A illustrates a wafer support pedestal 900 that can be employed in the reactor of FIG. 1, including a thermal sensor for sensing ion dose in a plasma immersion ion implantation reactor. The wafer support pedestal includes a support table 902 that may be an insulating layer containing a buried cathode electrode (not shown). The support table 902 can support a semiconductor wafer 904 that is to be processed. A small orifice 906 through the table 902 admits plasma ions into the hollow interior 908 of the pedestal 900. A small vacuum pump 910 maintains the pressure of the pedestal interior cavity below that of the reactor chamber to reduce the scattering of ions below the orifice 906. A thermal resistor 912 inside the pedestal interior 908 has one end 912a facing the orifice 906 so as to collect all the ions passing through the orifice 906. The opposite end 912b of the thermal resistor 912 is coupled to a heat sink 914 that cools the thermal resistor 912. An upper temperature probe 916 is coupled to the ion-receiving resistor end 912a and a lower temperature probe 918 is coupled to the cooled resistor end 912b. A differential amplifier 920 receives the outputs of the two temperature probes 916, 918 and senses the temperature difference between them. The output of the differential amplifier 920 may be optically coupled by an optical fiber coupler 922 to the processor 134 of FIG. 1 to avoid corruption of the measurement by RF noise. Preferably the thermal resistor 912 has a finite electrical resistivity (e.g., is not an electrical insulator) and has end 912b electrically connected to a DC power supply that is biased negatively relative the cathode potential or buried cathode electrode potential such that the thermal resistor 912 collects positive ions and repels electrons. More preferably, the thermal resistor 912 is made of a semiconductor such as silicon or silicon carbide or a material such as graphite. Typically the end 912b is biased 10 to 100 volts more negative than the cathode or buried cathode electrode potential.

As one option, a partially transparent screen grid 906-1 may be added between orifice 906 and thermal resistor end 912a and may be biased to repel secondary electrons that may be emitted from thermal resistor upon impact from energetic positive ion bombardment. Such a screen grid may have a bias voltage applied that is more negative than the bias applied to the thermal resistor.

Figure 9B:
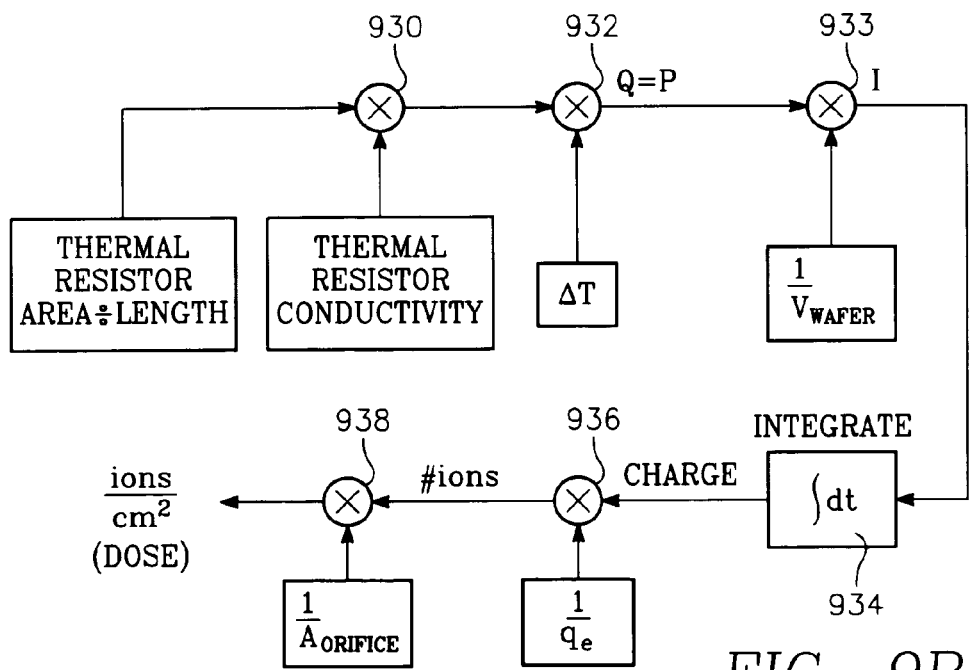
FIG. 9B depicts the process by which the apparatus of FIG. 9A measures ion implantation dose.

The processor 134 processes the temperature difference in the manner illustrated in FIG. 9B, to determine the ion dose on the wafer 904. The processor 134 multiplies (at block 930 of FIG. 3B) the thermal conductivity of the thermal resistor 912 material by the area divided by the length of the thermal resistor, and multiplies (block 932) the resulting product by the temperature difference received via the optical coupler 922. This determines the instantaneous power of the ions incident on the thermal resistor 912. This value is multiplied by the reciprocal of the D.C. wafer voltage (measured as describe previously in this specification) to determine the ion current incident on the orifice 906. The processor 134 tracks the time domain waveform of this current and integrates it over time (block 934) to determine the incident charge q. The processor 134 multiplies (block 936) this result by the reciprocal of the charge per atomic ion (the electron charge $q_e$) to determine the number of ions. This result is divided (block 938) by the area of the orifice to determine the charge per unit area of the incident ions, which is the implant dose.

Figure 10A:
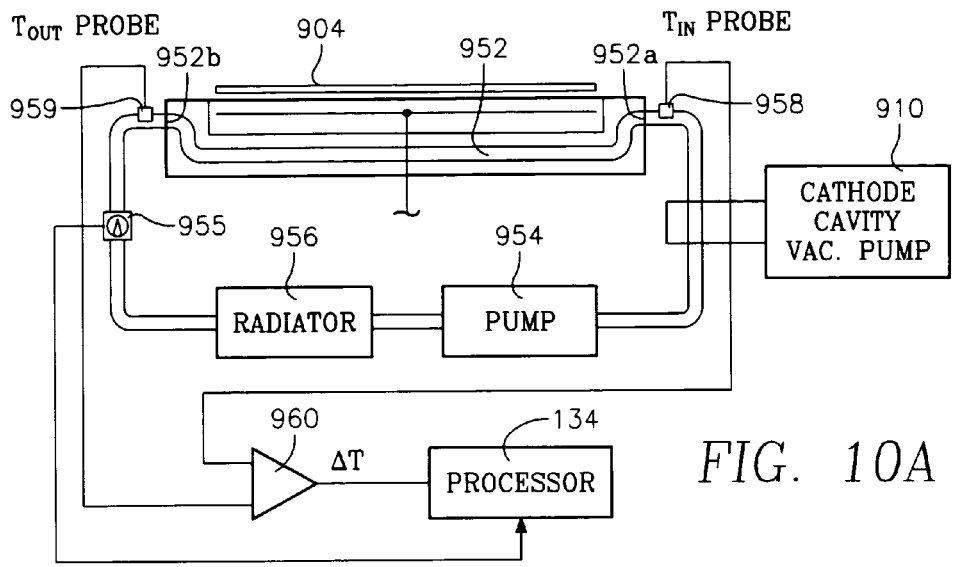
FIG. 10A illustrates a wafer support pedestal capable of making calorimetric measurements of ion implantation dose.

FIG. 10A illustrates a wafer support pedestal capable of providing a thermal measurement of ion implantation dose. The energy of the ions incident on the wafer or support pedestal is dissipated in the wafer, so that the wafer is heated and therefore must be cooled. The rate at which the wafer is heated corresponds to the power of the incident ions. The wafer pedestal is cooled (in order to control wafer temperature) by coolant circulating through internal coolant passages 952. A coolant pump 954 circulates the liquid coolant and a radiator 956 dissipates heat from the liquid coolant. An input temperature probe 958 monitors the coolant temperature at the coolant input 952a of the pedestal and an output temperature probe 959 monitors the coolant temperature at the coolant output 952b. A flow gauge 955 measures the volume flow rate of the coolant. A difference amplifier 960 receives the outputs of the two temperature probes 958, 959 and provides a temperature difference to the processor 134.

Figure 10B:
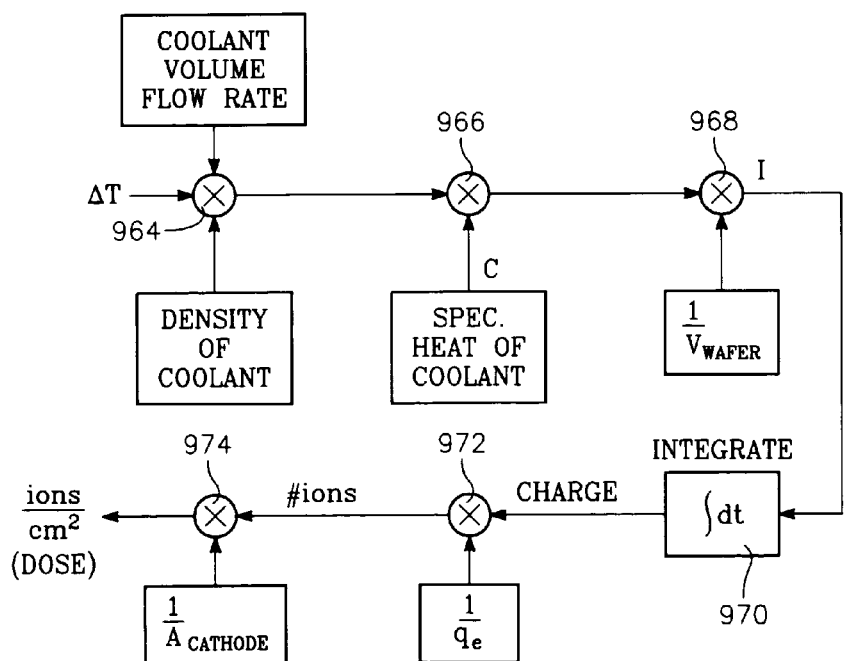
FIG. 10B depicts the process by which the apparatus of FIG. 10A measures ion implantation dose.

The processor 134 computes the ion dose from the temperature difference in the manner illustrated in FIG. 10B. Referring now to FIG. 10B, the processor 134 multiplies (block 964) the temperature difference by the product of the coolant density times the coolant volume flow rate. The resulting product equals the mass flow rate. Alternatively, the mass flow rate could be measured directly. The processor 134 multiplies (block 966) the product (i.e., the mass flow rate) by the specific heat of the coolant to determine the thermal power delivered to the wafer support pedestal or cathode. This power is multiplied (block 968) by the reciprocal of the wafer voltage (determined in the manner described above with reference to FIG. 4A) to determine the current on the cathode. The processor 134 integrates the current over time (block 970) to obtain the total charge incident on the cathode. The processor 134 multiplies (block 972) the charge by the reciprocal of the charge per ion (the electron charge) to determine the number of incident ions, and multiplies (block 974) the result by the reciprocal of the cathode area to obtain the ion dose (number of ions per unit area) as the final result.

For coolants that are comprised of more than one liquid, such as a mixture of deionized water and ethylene-glycol, the thermal power can be computed as the sum of the thermal power transferred by water (total volume flow rate times ratio of water volume to water+glycol volume times density of water times specific heat of water times temperature difference) and the thermal power transferred by glycol (total volume flow rate times ratio of glycol volume to water+glycol volume times density of glycol times specific heat of glycol times temperature difference). A device which measures relative density such as a hygrometer can be used to determine the ratio of water to water+glycol, if that ratio is unknown.

Figure 11:
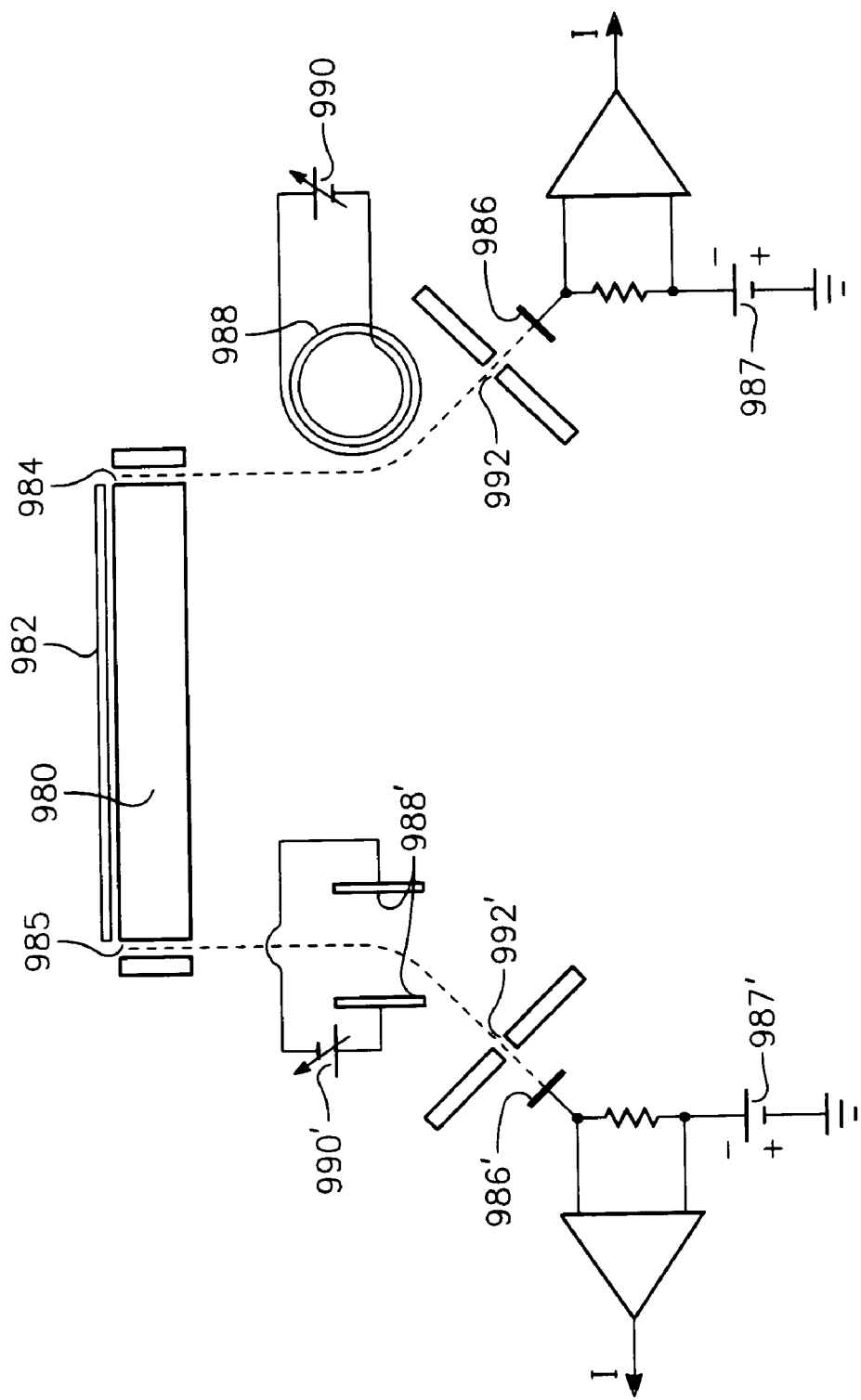
FIG. 11 illustrates a wafer support pedestal having electrical apparatus for measuring ion dose, one of which is mass selective and the other of which is energy selective.

Mass-Selected and Energy-Selected Faraday Cup Dosimetry:

FIG. 11 illustrates a wafer support pedestal 980 for supporting a semiconductor wafer 982 during processing in s plasma immersion ion implantation reactor, which may be the reactor of FIG. 1, for example. The pedestal 980 has an ion-collecting orifice 984 and a Faraday cup or electrode 986 near the orifice 984 negatively biased by a bias voltage source 987. An electromagnetic coil 988 supplied by a current source 990 bends the trajectory of incident ions emerging from the bottom of the orifice 984 so that only ions of a particular charge-to-mass ratio pass through a fixed aperture 992 to be sensed on the electrode 986. The current through the electromagnetic coil 988 can be selected to tune the system to count only a particular ion species. Alternatively, the electromagnet current can be swept across a range of values corresponding to a spectrum of atomic weights, and an ion count can be accumulated for each element of interest, to produce a distribution of ion population over atomic number.

The pedestal 980 has another ion-collecting orifice 985 and a Faraday cup or electrode 986' near the orifice 985 negatively biased by a bias voltage source 987'. A pair of electrostatic plates 988' energized by a voltage source 990' bends the trajectory of incident ions emerging from the bottom of the orifice 985 so that only ions of a particular energy pass through a fixed aperture 992' to be sensed on the electrode 986'. The voltage of the source 990' can be selected to tune the system to count only ions of a particular energy. Alternatively, the voltage can be swept across a range of values corresponding to a spectrum of energies, and an ion count can be accumulated for each element of interest, to produce a distribution of ion population over energy.

What is claimed is:

1. A method of performing plasma immersion ion implantation by implanting ions of a selected species into a production workpiece in a reactor chamber, comprising:

constructing a lookup table that correlates different values of a predetermined set of process parameters in said reactor chamber with measured values of an ion efficiency factor based upon measurements of plural ion implanted test workpieces, said ion efficiency factor defining a ratio of said selected species ion implanted in each test workpiece of said plural test workpieces to all species ion implanted into said each test workpiece during ion implantation of the selected species;

placing said production workpiece on a pedestal in said reactor chamber and feeding into said reactor chamber a process gas comprising said selected species;

coupling RF plasma source power to said process gas in said reactor chamber to generate a plasma comprising ions of said selected species so as to perform ion implantation of said ions of said selected species into said production workpiece;

coupling RF bias power to said production workpiece from an RF bias power generator through a bias feedpoint of said reactor chamber;

measuring RF current at said bias feedpoint to generate a current-related quantity;

computing an ion dose-related quantity from said current-related quantity, obtaining a present ion efficiency factor by sensing present values of said set of process parameters and applying said present values of said set of process parameters to said look-up table whereby to obtain from said look-up table said present ion efficiency factor, and multiplying said ion dose-related quantity by said present ion efficiency factor to produce a corrected ion dose-related quantity; and comparing the corrected ion dose-related quantity to a desired ion dose-related quantity to produce a difference, and changing the RF plasma source power as a function of said difference.

2. The method of claim 1 wherein said ion dose-related quantity is the ion dose, and wherein said computing the ion dose-related quantity comprises integrating said current-related quantity over a time duration of said ion implantation to produce the ion dose-related quantity.

3. The method of claim 1 wherein said ion dose-related quantity is ion dose rate, and wherein said computing the ion dose-related quantity comprises computing said dose rate as a proportional function of said current-related quantity.

4. The method of claim 1 wherein said computing an ion dose-related quantity comprises:

dividing, by the area of said production workpiece and by the charge of a single ion of said selected species in said plasma, said current-related quantity.

5. The method of claim 1 wherein said constructing said lookup table comprises:

producing said plural ion implanted test workpieces by ion implanting plural test workpieces in said reactor chamber under said different values of said predetermined set of process parameters;

testing each of said ion implanted test workpieces to determine the ion efficiency factor for each of said test workpieces; and correlating in said look-up table each said ion efficiency factor to the corresponding set of values of said set of process parameters.

6. The method of claim 5 wherein the testing comprises:

measuring volume density of said selected species in said each test workpiece as a function of depth in said each test workpiece and forming a density versus depth distribution; and integrating said density versus depth distribution over depth to produce an area density of said selected species.

7. The method of claim 6 wherein the integrating is preceded by transforming said RF current from said bias feed point to a location at least near said each test workpiece by a measurement point-to-workpiece transform.

8. The method of claim 7 further comprising determining said measurement point-to-workpiece transform prior to placing said each test workpiece in said reactor chamber by the following steps:

measuring a complex open circuit input impedance-related quantity at said, bias feedpoint;

measuring a complex short circuit input impedance-related quantity at said bias feedpoint; and computing said measurement point-to-workpiece transform from a combination of said open circuit input impedance-related quantity and said short circuit input impedance-related quantity.

9. The method of claim 8 wherein said open circuit impedance related quantity is one of:
 a. open circuit impedance;
 b. open circuit admittance;
 c. open circuit current, open circuit voltage and open circuit phase.

10. The method of claim 8 wherein said closed circuit impedance related quantity is one of:
 a. closed circuit impedance;
 b. closed circuit admittance;
 c. closed circuit current, open circuit voltage and open circuit phase.

11. The method of claim 8 wherein the transforming comprises:
 obtaining a plurality of frequency components comprising the fundamental and plural harmonics of the RF current and a voltage measured at the bias feedpoint;
 combining said plurality of frequency components with said transform to obtain a frequency domain version of the current at said each test workpiece; and
 transforming the frequency domain version of the current at the said each test workpiece into a time domain waveform of the current at said each test workpiece.

12. The method of claim 1 wherein:
 at least some of said present values of said process parameters lie between respective ones of the sets of process parameter values contained in said look-up table; and
 said obtaining said present ion efficiency factor comprises interpolating between corresponding ion efficiency factors stored in said look-up table.

13. The method of claim 1 wherein said predetermined set of process parameters comprise at least one of: plasma source power level, RF bias voltage RF bias current, chamber pressure, flow rate of the process gas.

14. The method of claim 1 wherein:
 said changing the source power comprises halting the ion implantation of said production workpiece when said corrected ion dose-related quantity reaches said desired ion dose-related quantity.

15. The method of claim 1 wherein the ion dose-related quantity is dose rate, said method further comprising:
 issuing an alarm at a user interface if said dose rate exceeds a dose-rate limit value.

16. The method of claim 1 further comprising:
 displaying said difference at a user interface.

17. The method of claim 1 further comprising measuring RF voltage at said bias feedpoint.

18. The method of claim 17 further comprising measuring ion energy of said selected species from said RF voltage.

19. The method of claim 18 wherein the measuring the ion energy comprises determining a characteristic parameter of said RF voltage.

20. The method of claim 19 wherein said characteristic parameter of RF voltage comprises one of:
 A. a time average of said RF voltage;
 B. a peak value of said RF voltage;
 C. a peak-to-peak value of said RF voltage;
 D. an RMS value of said RF voltage.

21. The method of claim 19 further comprising multiplying said characteristic parameter by the charge of an ion of said selected species in the plasma in said reactor chamber.

22. The method of claim 19 further comprising:
 comparing said ion energy with a desired ion energy value to determine an ion energy error; and
 adjusting power level of said RF bias power by an amount that is a function of said ion energy error.

23. The method of claim 19 further comprising:
 comparing said ion energy with a desired ion energy value to determine an ion energy error; and
 rendering a display at a user interface relating to said ion energy error.

24. The method of claim 17 further comprising:
 transforming said RF voltage from said bias feed point to a location at least near said production workpiece by a measurement point-to-workpiece transform.

25. The method of claim 24 further comprising determining said measurement point-to-workpiece transform prior to placing said production workpiece in said reactor chamber by the following steps:
 measuring a complex open circuit input impedance-related quantity at said bias feedpoint;
 measuring a complex short circuit input impedance-related quantity at said bias feedpoint; and
 computing said measurement point-to-workpiece transform from a combination of said open circuit input impedance-related quantity and said short circuit input impedance-related quantity.

26. The method of claim 25 wherein said open circuit input impedance-related quantity comprises one of:
 an open circuit input impedance;
 an open circuit input admittance;
 an open circuit current voltage and phase.

27. The method of claim 25 wherein said closed circuit input impedance-related quantity comprises one of:
 a closed circuit input impedance;
 a closed circuit input admittance;
 a closed circuit current voltage and phase.

28. The method of claim 25 wherein the transforming comprises;
 obtaining a plurality of frequency components comprising the fundamental and plural harmonics of the RF voltage and a current measured at the bias feedpoint;
 combining said plurality of frequency components with said transform to obtain a frequency domain version of a voltage at the production workpiece; and
 transforming the frequency domain version of the voltage at the production workpiece into a time domain waveform of the voltage at the production workpiece.

29. The method of claim 17 further comprising:
 holding said production workpiece on said pedestal by applying a D.C. chucking voltage to a buried electrode in said pedestal;
 determining from said RF voltage a D.C. workpiece voltage; and
 determining a net clamping voltage from said D.C. workpiece voltage and said D.C. chucking voltage.

30. The method of claim 29 wherein the determining the D.C. workpiece voltage comprises determining a time average of said RF voltage.

31. The method of claim 29 further comprising:
 comparing said net clamping voltage with a desired value to determine a clamping voltage error; and
 adjusting said D.C. chucking voltage in accordance with said clamping voltage error.

32. The method of claim 29 further comprising:
 sensing a temperature of said production workpiece;
 comparing said temperature with a desired temperature to determine a temperature error; and
 adjusting said D.C. chucking voltage by an amount tending to result in a reduction in said temperature error.

33. The method of claim 32 further comprising comparing said net clamping voltage with a clamping voltage desired range and rendering a user display in accordance with the comparing of said net clamping voltage and said clamping voltage desired range.

34. The method of claim 29 further comprising, prior to the determining the D.C. workpiece voltage:
   transforming said RF voltage from said bias feedpoint to a location at least near said production workpiece by a measurement point-to-workpiece transformation.

35. The method of claim 34 further comprising determining said measurement point-to-workpiece transformation prior to placing said production workpiece in said reactor chamber by the following steps:
   measuring a complex open circuit input impedance-related quantity at said bias feedpoint;
   measuring a complex short circuit input impedance-related quantity at said bias feedipoint; and
   computing said measurement point-to-workpiece transform from a combination of said open circuit input impedance-related quantity and said short circuit input impedance-related quantity.

36. The method of claim 35 wherein said open circuit input impedance-related quantity comprises one of:
   an open circuit input impedance;
   an open circuit input admittance;
   an open circuit current voltage and phase.

37. The method of claim 35 wherein said closed circuit input impedance-related quantity comprises one of:
   a closed circuit input impedance;
   a closed circuit input admittance;
   a closed circuit current voltage and phase.

38. The method of claim 1 wherein the measuring said RF current comprises sensing current measurement output of an RF probe connected at a measurement point at said bias feedpoint, said method further comprising obtaining a calibration factor for said RF current by performing the following steps prior to placing said production workpiece on said pedestal:
   coupling said RF probe between said RF bias power generator and a dummy resistance;
   comparing the current measurement output of said RF probe with the square root of the quotient of a known power output of said RF bias power generator divided by the resistance value of said dummy resistance to determine the calibration factor of said current measurement; and
   after the measuring the RF current, multiplying said current-related quantity by said calibration factor.

39. The method of claim 17 wherein the measuring said RF voltage comprises sensing the voltage measurement output of an RF probe connected at a measurement point at said bias feedpoint, said method further comprising obtaining a calibration factor for said RF voltage by performing the following steps prior to placing said production workpiece on said pedestal:
   coupling said RF probe between said RF bias power generator and a dummy resistance;
   comparing the voltage measurement output of said RF probe with the square root of the product of a known power output of said RF bias power generator multiplied by the resistance value of said dummy resistance, to determine the calibration factor of said voltage measurement; and
   after the measuring the RF voltage, multiplying said RF voltage by said calibration factor.

* * * * *